(12) United States Patent
Yucel et al.

(10) Patent No.: US 8,738,164 B2
(45) Date of Patent: May 27, 2014

(54) ARTICLE OF MANUFACTURE, COMPRISING TANGIBLE MEDIA STORING CONSTRAINTS FOR EVALUATING CANDIDATE DESIGNS BASED UPON CONSTRAINTS

(75) Inventors: Sermet Yucel, Edina, MN (US); M. Germana Paterlini, Edina, MN (US); Samuel E. Martin, St. Paul, MN (US); William D. Headrick, Maplewood, MN (US)

(73) Assignee: Certusoft, Inc., Minneapolis, MN (US)

( * ) Notice: Subject to any disclaimer, the term of this patent is extended or adjusted under 35 U.S.C. 154(b) by 72 days.

(21) Appl. No.: 13/461,963

(22) Filed: May 2, 2012

(65) Prior Publication Data

US 2012/0215499 A1    Aug. 23, 2012

Related U.S. Application Data

(62) Division of application No. 12/589,447, filed on Oct. 23, 2009, now Pat. No. 8,214,069.

(51) Int. Cl.
*G06F 19/00* (2011.01)
*G06F 17/50* (2006.01)
*G06G 7/48* (2006.01)

(52) U.S. Cl.
USPC ............... 700/95; 700/96; 700/97; 700/98; 700/103; 700/117; 703/1; 703/8

(58) Field of Classification Search
CPC . G06F 17/50; G06F 17/5004; G06F 17/5086; G06F 17/509
USPC .......... 700/1, 95–98, 103, 117; 703/1–2, 7–8; 716/100–101
See application file for complete search history.

(56) References Cited

U.S. PATENT DOCUMENTS

| | | | | |
|---|---|---|---|---|
| 5,552,995 | A | * | 9/1996 | Sebastian ..................... 700/97 |
| 5,822,206 | A | * | 10/1998 | Sebastian et al. ............. 700/97 |
| 5,903,466 | A | * | 5/1999 | Beausang et al. ............ 716/104 |
| 5,978,785 | A | * | 11/1999 | Johnson et al. ................ 706/54 |
| 5,980,084 | A | * | 11/1999 | Jones et al. .................... 700/95 |
| 6,253,365 | B1 | * | 6/2001 | Baldwin ........................ 716/102 |
| 6,269,467 | B1 | * | 7/2001 | Chang et al. ................. 716/104 |

(Continued)

OTHER PUBLICATIONS

Office Action, U.S. Appl. No. 12/589,492, Filed Oct. 23, 2009, Yucel et al.

(Continued)

*Primary Examiner* — Ramesh Patel
(74) *Attorney, Agent, or Firm* — Beck & Tysver PLLC

(57) ABSTRACT

The invention is a method and apparatus for automatically generating an optimal configuration of a product, using logic implemented on a digital computer processing system. A general configuration will be broken down into a hierarchy of subdesigns by a designer of an artifact type. A particular instance of the type must satisfy user-specified external parametric constraints. Constraints may take the form of a range of values for some performance characteristic or to satisfy laws or business requirements. Hierarchical decomposition facilitates solution of complex problems. Criteria for a best solution may be specified for a given subdesign, a collection of subdesigns, or globally. Tentative selection of a particular subdesign may impose internally generated constraints upon a subsequent subdesign. If no acceptable solution is found for a subdesign, the candidate overall configuration rolls back to the most complete viable partial collection of subdesigns. The method transforms constraints into a concrete design.

1 Claim, 30 Drawing Sheets

(56) References Cited

U.S. PATENT DOCUMENTS

| | | | |
|---|---|---|---|
| 6,321,186 B1* | 11/2001 | Yuan et al. | 703/15 |
| 6,983,233 B1* | 1/2006 | Falcioni et al. | 703/12 |
| 7,043,463 B2* | 5/2006 | Bonabeau et al. | 706/13 |
| 7,103,434 B2* | 9/2006 | Chernyak et al. | 700/98 |
| 7,143,341 B1* | 11/2006 | Kohli | 715/234 |
| 7,252,263 B1* | 8/2007 | Hagemeister et al. | 244/1 R |
| 7,627,850 B2 | 12/2009 | Kennedy et al. | |
| 8,219,228 B2* | 7/2012 | Yucel et al. | 700/97 |
| 2004/0024623 A1* | 2/2004 | Ciscon et al. | 705/7 |
| 2005/0080502 A1* | 4/2005 | Chernyak et al. | 700/97 |
| 2011/0098835 A1* | 4/2011 | Yucel et al. | 700/103 |
| 2012/0221136 A1* | 8/2012 | Yucel et al. | 700/103 |

OTHER PUBLICATIONS

Altium Limited, P-cad 2002, Parametric Constraint Solver User's Guide, Oct. 14, 2002, pp. 1-87.

Wielinga & Schreiber, University of Amsterdam, Configuration Design Problem Solving, May 3, 2001; pp. 1-16.

* cited by examiner 300,320

| Top Speed | Min. | 70 mph | Max. | 75 mph | | | 324 |

| Gradeability | Min. | 2.0 % | Max. | 2.2 % | @ | 60 mph | 325 |
| | Min. | 5.0 % | Max. | 5.5 % | @ | 25 mph | 326 |

| Wheelbase | Min. | 185 in | Max. | 200 in | 327 |

Engine

| Power | Min. | 340 HP | Max. | 390 HP | 328 |

Model — 329
- ☐ Engine A, 368HP@1500 RPM
- ☐ Engine B, 347HP@1400 RPM

Manufacturer — 330
- ☑ Engine Manufacturer A
- ☑ Engine Manufacturer B
- ☐ Engine Manufacturer C
- ☐ Engine Manufacturer D Driveline — 331
| Joint Angle | Min. | 0.5 | Max. | 2.5 |
| Driveshafts | Min. | 2 | Max. | 3 |

*Fig. 3b*

| Parent Parameter | Child Parameter | Parameter Type |
|---|---|---|
| Environment | Name | String |
| | Road | String |
| | Temperature | Number |
| | Pressure | Number |
| | Elevation | Number |
| | Grade | Number |
| | State | String |
| | Country | String |

*Fig. 5a*

| Parent Parameter | Child Parameter | Parameter Value |
|---|---|---|
| Environment | Name | Minnesota |
| | Road | Concrete |
| | Temperature | 60 Fahrenheit |
| | Pressure | 1.0 Atmosphere |
| | Elevation | 100 Feet |
| | Grade | 1.0 Percent |
| | State | MN |
| | Country | USA |

*Fig. 5b*

| Parent Parameter | Child Parameter | Parameter Type |
|---|---|---|
| Engine | Name | String |
| | Manufacturer | String |
| | Model | String |
| | Description | String |
| | Peak Torque | Number |
| | Peak Torque RPM | Number |
| | Peak Power | Number |
| | Peak Power RPM | Number |
| | Governed Speed | Number |
| | Power Curve | Structured |

*Fig. 5c*

| Parent Parameter | Child Parameter | Parameter Value |
|---|---|---|
| Engine | Name | EHD2100 |
| | Manufacturer | EHD |
| | Model | EHD2100 |
| | Description | Heavy Duty Engine |
| | Peak Torque | 1400 |
| | Peak Torque RPM | 1600 |
| | Peak Power | 340 |
| | Peak Power RPM | 1400 |
| | Governed Speed | 1600 |
| | Power Curve | PC0012 |

*Fig. 5d*

| Parent Parameter | Child Parameter | Parameter Type |
|---|---|---|
| Power Curve | Name | String |
| | Power Values | List<Number> |
| | RPM Values | List<Number> |

500, 511, 540 — 541

| Parent Parameter | Child Parameter | Parameter Value |
|---|---|---|
| Power Curve | Name | PC0012 |
| | Power Values | {300, 320, 340, 315} |
| | RPM Values | {1000, 1200, 1400, 1600} |

500, 510, 521 — 544, 542, 543

Parameter Type CenterBearing {
   String name;
   String description;  — 700
   Double centerOffset;
   Double verticalOffset;
   Double horizontalOffset;
   Double pinCenterOffset; — 705
   Assembly assembly;
   Box bounds; — 710 ⟋— 720

715 —— Function draw (String displayName_) { }; — 730
725 —— Function CenterBearing find (String name_) {};
735 —— Function CenterBearing create (Double pinCenterOffset_,
                                      Double centerOffset_,
                                      Double verticalOffset_,
                                      Double horizontalOffset_) {}

740 —— Function arrange () {};
745 —— Function display () {};
750 —— Function initialize () {};
};

*Fig. 7*

```
          Integer firstNumber =0;
800 ─┐    Integer secondNumber =0;
     └─── search {
         ┌── branch (Integer i = 1; i < 20; i = i + 1)  ⎫
810 ────┤   {                                            ⎬ 811
         └      firstNumber = i;                         ⎭
            }
         ┌── branch (Integer i = 1; i < 20; i = i + 1)  ⎫
810 ────┤   {                                            ⎬ 811
         └      secondNumber = i;                        ⎭
820 ──┐     }
      └── require firstNumber * secondNumber ==18;
          };
```

Fig. 8a

```
        ┌── 613
Box box1;
Box box2;     ┌── 800
search {  ───┘
         ┌── branch (Integer i = 0; i < Box.count; i = i + 1)  ⎫
810 ────┤    {                                                  ⎬ 811      ┌── 840
         └       box1 = Box[i];                                 ⎭
             }
             branch (Integer i = 0; i < Box.count AND box1.length + box2.length < 60; i = i + 1) ⎫
810 ────┤    {                                                                                     ⎬ 811
         └       box2 = Box[i];                                                                    ⎭
             }
             maximize box1.volume + box2.volume;
   };              └── 830
```

Fig. 8b

```
                                            /—— 1510
       Parameter Type CenterBearingBracket {
         String name;
         String description;
         Assembly assembly;   /—— 1520
         Box verticalPlate;
         Box horizontalPlate;  /—— 1525
         Double centerOffset;
         Double verticalOffset;
         Double horizontalOffset;
         Double angle = 0.0;
         Double thickness ;  /—— 1500

Function arrange () {     /—— 1530
1535 ——    GeometricSolver solver = new GeometricSolver {};
           solver.fix(verticalPlate);
         ┌ solver.constrain(verticalPlate.widthCenter.coincidentToPlane(horizontalPlate.widthCenter));
         │ solver.constrain(verticalPlate.bottomLeftRear.coincidentToPoint(horizontalPlate.bottomLeftRear));
         │ solver.constrain(verticalPlate.bottomRightRear.coincidentToPoint(horizontalPlate.bottomRightRear));
   1540 ┤   AngleConstraint angleConstraint =
         │       horizontalPlate.lengthCenter.angleTo(verticalPlate.lengthCenter).around(verticalPlate.widthCenter).mustEqual(
         │            Math.toRadians(angle));
         └ solver.constrain(angleConstraint);
           solver.solve();
         }; // arrange   \—— 1550
       }
```

*Fig. 15*

```
Parameter Type CenterBearingBracket {
    String name;
    String description;
    Assembly assembly; Box verticalPlate;
    Box horizontalPlate;
    Double centerOffset;
    Double verticalOffset;
    Double horizontalOffset;
    Double angle = 0.0;
    Double thickness;
    Function draw (String displayName) {
        assembly.draw(name);
        /*end method body*/
    }; // draw
    Function CenterBearingBracket find (
            String name_){
        List<CenterBearingBracket> results =
            CenterBearingBracket[name == name];
        CenterBearingBracket result = results[0];
        result.initialize();
        return result;
        /*end method body*/
    }; // find
    Function CenterBearingBracket create (
        Double verticalOffset_,
        Double horizontalOffset_,    Double angle_,
        Double thickness) {
        CenterBearingBracket bracket =
            new CenterBearingBracket
        verticalOffset verticalOffset_;
        horizontalOffset = horizontalOffset_;
        angle = angle_; thickness = thickness_;
        bracketinitialize();
        return bracket;
        /*end method body*/
    };// create
    Function test () {
        Debug.print(name +
            " passed the integrity tests.");
        /*end method body*/
    }; // test
    Function arrange () (
        GeometricSolver solver
            = new GeometricSolver ((;
        solver.fix{vertical Plate);
        solver.constrain(verticalPlate.widthCenter
            .coincidentToPlane(horizontalPlate
            .widthCenter));
```

Fig. 16a

```
            solver.constrain(verticalPlate
                .bottomLeftRear
                .coincidentToPoint(horizontalPlate
                .bottomLeftRear));
            solver.constrain(verticalPlate
                .bottomRightRear
                .coincidentToPoint(horizontalPlate
                .bottomRightRear));
            AngleConstraint angleConstraint =
                horizontalPlate.lengthCenter
                .angleTo(verticalPlate.lengthCenter)
                    .around(verticalPlate.widthCenter)
                    .mustEqual(Math.toRadians(angle));
            solverconstrain(angleConstraint);
            solver.solve();
            Debug.print(tracket horizontal plate: "
                + horizontalPlate.status);
            Debug.print("bracket vertical plate: "
                + verticalPlate.status);
            Debug.print("bracket angle constraint: "
                + angleConstraint.dimension.status);
            /*end method body*/
        ); // arrange
        Function display () (
            CenterBearingBracket result = find(name);
            result.draw(result.name);
            /*end method body'/
        }; // display
        Function initialize () {
            Double width =
            UnitConverter.inchesToMeters(10.0);
            verticalPlate = Box.create(width/2,
                width/2, thickness/2, thickness/2,
                0, Math.abs(verticaltaffset));
            horizontalPlate =
                Box.create(width/2, width/2,
                Math.abs(horizontalOffset)/2,
                Math.abs(horizontalOffset)/2,
                thickness/2, thickness/2);
            arrange();
            assembly = new Assembly ();
            assembly.addBodies({horizontalPlate,
                verticalPlate});
            /*end method body*/
        }; // initialize
    }; //CenterBearingBracket
```

Fig. 16b

```
Parameter Type CenterBearing {
    String name;
    String description;
    Double centerOffset;
    Double verticalOffset;
    Double horizontalOffset;
    Double pinCenterOffset;
    Assembly assembly;
    Box bounds;
    Function draw (String displayName_){
        assembly.draw(displayName_);
        /*end method body*/
    }; // draw
    Function CenterBearing find (String name) {
        List<CenterBearing> results
            = CenterBearing[name == name_];
        CenterBearing result = result*);
        result.initialize();
        return result;
        /*end method body*/
    }; // find
    Function CenterBearing create (
        Double pinCenterOffset_,
        Double centerOffset_,
        Double verticalOffset_,
        Double horizontalOffset j {
        CenterBearing cb = new CenterBearing
        {
            centerOffset = centerOffset_;
            verticalOffset = verticalOffset_;
            horizontalOffset = horizontalOffset_;
            pinCenterOffset = pinCenterOffset_;
        }
        cb.initialize();
        return cb;
        /*end method body*/
    }; create
    Function test (){
        Debug.print(name +
            " passed the integrity tests.");
        /end method body*/
    }; // test
    Function arrange () {
        /*end method body`/
    }; // arrange
    /**
    * Displays a selected object in the Data Edit Panel.
```

```
    */
    Function display (){
        CenterBearing result = find(name);
        result.draw(result.name); /*end method body*/
    }; // display
    Function initialize () {
        bounds = Box.create(verticalOffset,
            verticalOffset,verticalOffset14,
            verticalOffset/4, verticalOffset/2,
            verticalOffset/2);
        arrange();
        assembly = new Assembly {};
        assembly.addBody(bounds);
        /*end method body*/
    }; // initialize
}; //CenterBearing
```

DRIVELINE REPORT:
Driveline Optimization Status : Succeeded
Effective Torsional Angle : 2.002943
Effective Inertia Coast Angle : 3.405492
Effective Inertia Drive Angle : 0.934189
Driveline Grade : 76
Residual Angle : 0.025311
Residual Angle Grade: 97.468912
Residual Torsional Acceleration : 107.861866
Residual Torsional Acceleration Grade: 78.427627
Residual Drive Acceleration : 23.463910
Residual Drive Acceleration Grade: 97.653609
Residual Coast Acceleration : 311.810226
Residual Coast Acceleration Grade: 68.818977
Residual Inertia Acceleration : 288.346317
Residual Inertia Acceleration Grade: 42.330737

*Fig. 18*

Name : Joint #1

Joint Angle(Degrees): 1.203232
Joint Phase(Degrees): 180.000000
Joint Plane Normal: (-1.000000,0.000000,0.000000)

Name : Joint #2

Joint Angle(Degrees): 1.371482
Joint Phase(Degrees): 90.000000
Joint Plane Normal: (-1.000000,0.000000,0.000000)

Name : Joint #3

Joint Angle(Degrees): 1.205574
Joint Phase(Degrees): -88.926118
Joint Plane Normal: (-0.018742,-0.999694,0.016146)

Name : Joint #4

Joint Angle(Degrees): 1.830193
Joint Phase(Degrees): 48.816377
Joint Plane Normal: (0.752439,0.658140,-0.026204)

Transmission Pin Center (3.722540,0.207140,0.000000)
Rear Pin Center of LOADED(7.498800,0.291100,0.024100)

```
Name : S1
Component Code : None
Support Name : Unsupported
Type : Transmission Shaft
Center Line (0.000000,-0.061049,-0.998135)
Side View Angle in Degrees : 3.500000
Top View Angle in Degrees : 0.000000
Length : (1.000000)
Location Z : None
Driven Point : (0.000000,-0.146091,-2.724405)
Driving Point : (0.000000,-0.207140,-3.722540)
Driven Yoke Axis : (0.000000,0.998135,-0.061049)
Driving Yoke Axis : (0.000000,0.998135,-0.061049)

Name: S2
Component Code : None
Support Name : Unsupported
Type : Intermediate Supported Shaft
Center Line : (0.000000,-0.040075,-0.999197)
Side View Angle in Degrees : 2.296768
Top View Angle in Degrees : 0.000000
Length : (0.978483)
Location Z : None
Driven Point : (0.000000,-0.207140,-3.722540)
Driving Point : (0.000000,-0.246353,-4.700237)
Driven Yoke Axis : (1.000000,0.000000,0.000000)
Driving Yoke Axis : (1.000000,0.000000,0.000000)

Name S3
Component Code : None
Support Name Unsupported
Type : Intermediate Supported Shaft
Center Line : (0.000000,-0.016149,0.999870)
Side View Angle in Degrees : 0.925285
Top View Angle in Degrees : 0.000000
Length : (1.653518)
Location Z : None
Driven Point : (0.000000,-0.246353,-4.700237)
Driving Point : (0.000000,-0.273055,-6.353539)

Driven Yoke Axis : (0.000000,-0.999870,0.016149)
Driving Yoke Axis (0.000000,-0.999870,0.016149)

Name : 54
Component Code : None
Support Name : Unsupported
Type : Intermediate Unsupported Shaft
```

```
Center Line : (-0.021036,-0.015751,-0.999655)
Side View Angle in Degrees : 0.902687
Top View Angle in Degrees 1.205511
Length : (1.145656)
Location Z : None
Driven Point : (0.000000,-0.273055,-6.353539)
Driving Point : (-0.024100,-0.291100,-7.498800)
Driven Yoke Axis : (-0.999779,0.000336,0.021033)
Driving Yoke Axis : (-0.999779,0.000336,0.021033)

Name : S5
Component Code : None
Support Name : Unsupported
Type : Rear Axle Shaft
Center Line : (0.000000,-0.039783,-0.999208)
Side View Angle in Degrees : 2.280000
Top View Angle in Degrees : 0.000000
Length : (1.000000)
Location Z : None
Driven Point : (-0.024100,-0.291100,-7.498800)
Driving Point : (-0.024100,-0.330883,-8A98008)
Driven Yoke Axis : (-0.000249,0.999208,-0.039783)
Driving Yoke Axis : (-0.000249,0.999208,-0.039783)
```

*Fig. 20b*

ARTICLE OF MANUFACTURE, COMPRISING TANGIBLE MEDIA STORING CONSTRAINTS FOR EVALUATING CANDIDATE DESIGNS BASED UPON CONSTRAINTS

CROSS-REFERENCES TO RELATED APPLICATIONS

This application is a divisional of U.S. patent application Ser. No. 12/589,447, filed on Oct. 23, 2009 now U.S. Pat. No. 8,214,069, entitled "Automated Hierarchical Configuration of Custom Products with Complex Geometries: Method and Apparatus," having inventors Sermet Yücel, William D. Headrick, Samuel E. Martin, and M. Germana Paterlini, which is hereby incorporated by reference. This application is related to U.S. patent application Ser. Nos. 13/462,065, filed May 2, 2012 and 13/462,078, filed May 2, 2012, having the same title and inventors as the instant application; these applications are hereby incorporated by reference. This application is related to U.S. patent application Ser. No. 12/589,492, filed on Oct. 23, 2009, entitled "A Parametric Configurator for Product Design: System and Method," having inventors Sermet Yücel, William D. Headrick, Samuel E. Martin, and M. Germana Paterlini, which is hereby incorporated by reference. This application is also related to U.S. patent application Ser. Nos. 13/462,065 and 13/462,078, both divisionals of application Ser. No. 13/589,447 and both filed May 2, 2012.

FIELD OF THE INVENTION

The present invention relates to a method and system for automatically configuring an optimal geometry for a custom product. More specifically, it relates to hierarchical configuration based upon a user-specified set of constraints upon geometric and physical parameters.

BACKGROUND OF THE INVENTION

A manufacturer represents a product to a customer as a set of features, where each feature is commonly designated by an alphanumeric feature code. A published specification of a product offering by a manufacturer typically includes the following: a model number; standard features; optional features; and feature compatibility.

In most existing systems, when a customer is interested in selecting a configuration for a new product, the customer configures a product by selecting a standard model and a set of optional features. For example, in a product configuration process used for trucks, a typical heavy duty truck model may have up to one thousand standard feature codes and up to ten thousand optional feature codes. As is apparent, an extremely large number of potential product configurations are possible even for a well-defined product type like a heavy duty truck.

During existing product configuration processes, a customer will typically use a sales configurator to ensure that all necessary product features are selected and that all features are mutually compatible. Upon receiving the customer order for the selected configuration, the manufacturer generates a bill of materials from the list of features, through use of an order configurator (also known as a "product configurator") component or process, which converts sales features into a bill of materials using a set of rules. This simplified process of creating a product configuration, based on rule-based analysis of selected features from pre-engineered designs, is commonly referred to in the art as "mass customization."

Mass customization, therefore, uses a defined system to produce custom output, providing many of the advantages of mass production processes with individual customization. Mass customization does not add extra costs so long as a customer selects only published (i.e., offered for sale and pre-engineered) features, and those published features are so chosen as to necessarily generate a complete bill of materials. When all of the features, the bill of materials, and rules defining the possible choices of product designs are in place, the process from sales quotes to bill of material generation may be automatically executed. Thus, mass customization of the product is sometimes possible at no incremental engineering cost.

The value of mass customization breaks down or becomes unsustainable, however, when customers request undocumented (i.e., not-yet engineered) features, especially if pre-engineered combinations account for a small percentage of total sales. When a pre-engineered product configuration is rarely selected by customers, the engineering and marketing investments turn into a loss. Forecasting prior to pre-engineering which combinations are likely to be popular may increase the probability that existing designs will be chosen more frequently, but cannot effectively address the fundamental problem: that pre-engineering must be done at all.

Rules-based configurators are a common approach often used in the mass customization design process. A user can select components from groups based on compatibility of the components for the product being configured. A model for the product is defined by the parts, the groups, the required choices, and by rules that define compatible relationships between the features and parts. In the majority of cases, a missing rule or feature requires an order-specific engineering intervention. The rules-based approach also has problems dealing with complex geometries. The limitations of rules-based configurators can be traced to two causes. First, features are symbols with no semantic content. Therefore, rules are usually expressed in propositional logic that has very limited expressive power. The number of rules grows very rapidly with the number of features and feature types, and every possible rule cannot be realistically expressed for complex products. Second, rule engines have very limited search, optimization, and constraint solving capability. They are not intended to perform engineering design. Instead, configurators are used for automating product and feature selection within the scope of already-engineered features, parts, and configurations.

SUMMARY OF THE INVENTION

A comprehensive solution for configuring products that are truly optimized to each customer's requirements must go beyond selection of features and parts. What is needed are techniques that enable a product design to be created and optimized at the point of sale, without requiring pre-engineering of the product by a manufacturer, and without requiring customer commitment to a particular manufacturer during the design phase.

An alternative approach to feature-based and rules-based mass customization is presented herein, which we shall refer to as "parametric configuration." Parametric configuration enables the creation and selection of a product design without the necessity of pre-engineering and rules-based product documentation. A parametric configuration is capable of optimizing extremely complex products and therefore producing a design that fully satisfies both manufacturer and customer requirements.

The presently disclosed parametric configuration techniques are capable of automating sales engineering, creating the best product design on demand, and minimizing the costs and delivery delays associated with customization. These parametric configuration techniques, driven by search and optimization on the basis of geometric and physical characteristics, can automatically create a new product design that not only meets customer specifications, but also meets criteria for optimal configuration of the product for the customer requirements.

Numerous types of product types and product components can be designed, created, and deployed according to embodiments of parametric configuration. To facilitate understanding on the part of the reader, this application discusses, as exemplary of the parametric configuration technique, the design of heavy duty trucks. The choice of heavy duty truck design as exemplary is motivated in part by the fact that design of a driveline is not feasible with existing techniques employing a configurator.

Consider, for example, the design of a particular product type, a school bus. The parametric configuration approach is typically performed in three phases. In the first phase, one or more designers might specify constraints that define the overall characteristics of a bus, common to all buses or to buses a particular type. The general configuration for the product may be broken down into a hierarchy of subdesigns by a designer of the product type. For example, a bus might have a cab, a chassis, a driveline, seats, windows, and safety hatches, laid out in a familiar way. The first phase will specify constraints on how these objects are related geometrically and physically, and may also specify various acceptable ranges of certain values, which might be dictated by functionality, performance, and comfort. Some of these constraints may be mandated by law. In the second phase, a user, which might be a customer, might specify additional constraints. For example, the user might specify a range for how powerful the engine will be, or whether the bus will include a lavatory. In the third phase, a parametric configurator solves for the best design that satisfies the constraints from both the first and second phases. As will be discussed below, the solution might itself automatically produce additional constraints on aspects of the design.

Manufacturing complex products from customer constraints requires generating 3D models, searching features and parts, and optimizing performance. In contrast to existing product configurators that rely on rule-based selection of pre-engineered product features, a parametric configurator enables an automated product design from scratch based on the geometric and physical characteristics, and relationships between physical and geometric characteristics. Parametric configuration may be enabled by the following components operating in an automated computing system: a parametric configurator; a parametric configuration language; a parametric data management system; parametric configurator user interfaces; and parametric data management system user interfaces.

Constraints from designers or customers might be input to a computer system or database through a user interface, such as a graphical user interface, or by program instructions. In general, program instructions could take any form, being specified in a standard procedural language such as C, or an object oriented language such as Java. Some embodiments of the invention, however, include an object oriented parametric control language that is designed specifically to represent parameters and constraints upon those parameters.

Embodiments of a parametric configurator may include a search engine that can find a not-yet-engineered solution that meets customer, regulatory, and engineering requirements. A parametric configurator may also have optimization capabilities that associate with candidate solutions respective scores, or goodnesses, that can be used to rank the candidates in the selection process.

Parametric configuration may perform hierarchical design, partitioning an overall product design into a sequence of subdesigns. Thus, except for the last subdesign process, every subdesign process in some embodiments has a "next" subdesign process. A candidate solution for a given subdesign might only be viable if subdesigns, as yet unsolved by the parametric configurator, have a viable candidate solution. When feasible candidates for a given subdesign process are exhausted, a parametric configurator may roll back its processing to a subdesign process earlier in the sequence that still has potentially viable candidates. Typically, the configurator will roll back to the most recent (in terms of the sequence) subdesign process S for which candidates for the next subdesign after S remain untested for viability.

Constraints representing requirements upon a design can be grouped into two types, external and internal. Constraints specified by the designer and by the user are external to the execution of the parametric configurator to create a design. Other constraints, however, may be produced automatically by parametric configuration. These "internal" constraints cannot be known in advance. For example, a seat cannot be bolted to a bus on a weld joining plates in the floor. If one subdesign process selects the candidate location of the plates, then a seating subdesign must satisfy geometric constraints imposed internally by the parametric configurator to respect the weld locations. If, however, no viable seating arrangement is found for a given layout of plates, then the hierarchical design process might roll back to try another candidate plate layout. In such a case, the parametric configurator might discard the subdesign-specific internal constraint, which has been rendered superfluous.

A given constraint, whether external or internal, may require a choice from a finite number of values. For example, whether a bus contains a lavatory is a binary choice. The number of seats may be specified to be in a range from 20 to 22, again a finite number of alternatives. On the other hand, some ranges are continuous, such as a requirement that the distance between seats in a bus be between 17 and 19 inches. Continuous constraints will typically be discretized by the parametric configurator into a finite set of parameter values that span a range of parameter values. For the seat separation, the range might be divided into intervals of 0.1 inch.

After such discretization, the number of possible combinations of all choices for the various parameters is combinatorial, and typically many combinations will be incompatible. For a complex problem, the number of combinations can be enormous. The hierarchical approach of splitting the overall design into a sequence of subdesigns can reduce this complexity.

A subdesign solution must, as a minimum, meet all relevant external and internal constraints. A parametric configurator may contain a search engine that can evaluate a set of candidate subdesign solutions to search for a single viable solution. A parametric configurator may also include an optimization engine which, in contrast, may consider all viable solutions from a set of candidate subdesign solutions.

Criteria for a best solution may be specified that allow viable candidates to be scored and ranked to find a best. Some embodiments of parametric configuration may employ an approach that is locally optimal, rather than globally optimal, in order to reduce complexity of a problem. When two subdesigns are optimized independently of each other, the combined design might not be the overall best. Consider, for example, the problem of finding, from the set of positive integers, the factors of 12 that have the smallest total. The global solution is the pair of factors 3 and 4, which total to 7. But if the best first factor is chosen without regard to the second, then 1 and 12 be chosen, which total to 13. A designer user, through parametric configuration language that will be enforced by the configurator, can select those subdesigns for which search rather than optimization will produce a satisfactory solution, and those collections of subdesigns for which local, rather than combined or global, optimization will suffice.

Parametric configuration language can be used to specify constraints, to access and query models and model instances stored in a parametric configuration data system, to define and sequence subdesigns, to specify goodness measures and associate them with subdesigns, and to cause the parametric configurator to execute other tasks commonly associated with modern object oriented computer languages.

Parametric configuration is a computerized method, system, and (when implemented on a computer) machine to customize product designs; generate lists of features and parts for the product design; create bills of materials for product design; to generate a price quotation; and to enhance other post-design processes. A product may be manufactured according to the design. As a non-limiting example, a parametric configurator is particularly useful in design of a motor vehicle and the complex standard-driven components of a vehicle, such as seats, engines, drivelines, and the like. The following disclosure provides examples for various components of ground vehicles and other complex products using parametric configuration techniques.

Use of these various tools and components facilitates design of custom products from a set of parameters (i.e., characteristics and constraints) in real time, rather than relying on a selection of pre-engineered features and a rule-based configuration process. Techniques of parametric configuration assist with meeting the demand for prompt customer service and drastically reduce engineering re-work. Parametric configuration deemphasizes product compatibility rules written in terms of feature codes. Instead, it captures the compatibility between parts and features at the level of functionality, performance, and esthetics. For example, some embodiments create a design based on characteristics of physics and geometry.

BRIEF DESCRIPTION OF THE DRAWINGS

FIG. 3b is an exemplary form whereby a customer might specify constraints on a particular instance of a product design for parametric configuration.

FIG. 5a is a table illustrating exemplary environmental parameters for a truck design, and their types.

FIG. 5b is a table illustrating exemplary environmental parameters for a truck design, and their values.

FIG. 5c is a table illustrating exemplary engine parameters and their types.

FIG. 5d is a table illustrating exemplary engine parameters and their values.

FIG. 7 is a listing in a parametric configuration language of a parametric model for a center bearing of a truck.

FIG. 8a is a listing in parametric configuration language of a simple search.

FIG. 8b is a listing in parametric configuration language of a simple optimization.

FIG. 15 is parametric control language code illustrating a geometric solver for a parametric model of a driveline center bearing bracket for a truck.

FIGS. 16a and 16b show a complete model, specified in parametric control language code, for designing a center bearing bracket.

FIGS. 17a and 17b show a complete model, specified in parametric control language code, for designing a center bearing.

FIG. 18 is a report indicating a measure of goodness of a driveline relative to a set of constraints on its geometry and physics.

FIG. 19 shows a driveline detailed specification, produced by parametric configuration, including the physical characteristic of each driveline joint that are the primary determinant of the driveline goodness.

FIGS. 20a and 20b display a driveline specification, produced by parametric configuration, for manufacturing and assembling the driveline.

DETAILED DESCRIPTION OF EXEMPLARY EMBODIMENTS

Figure 1:
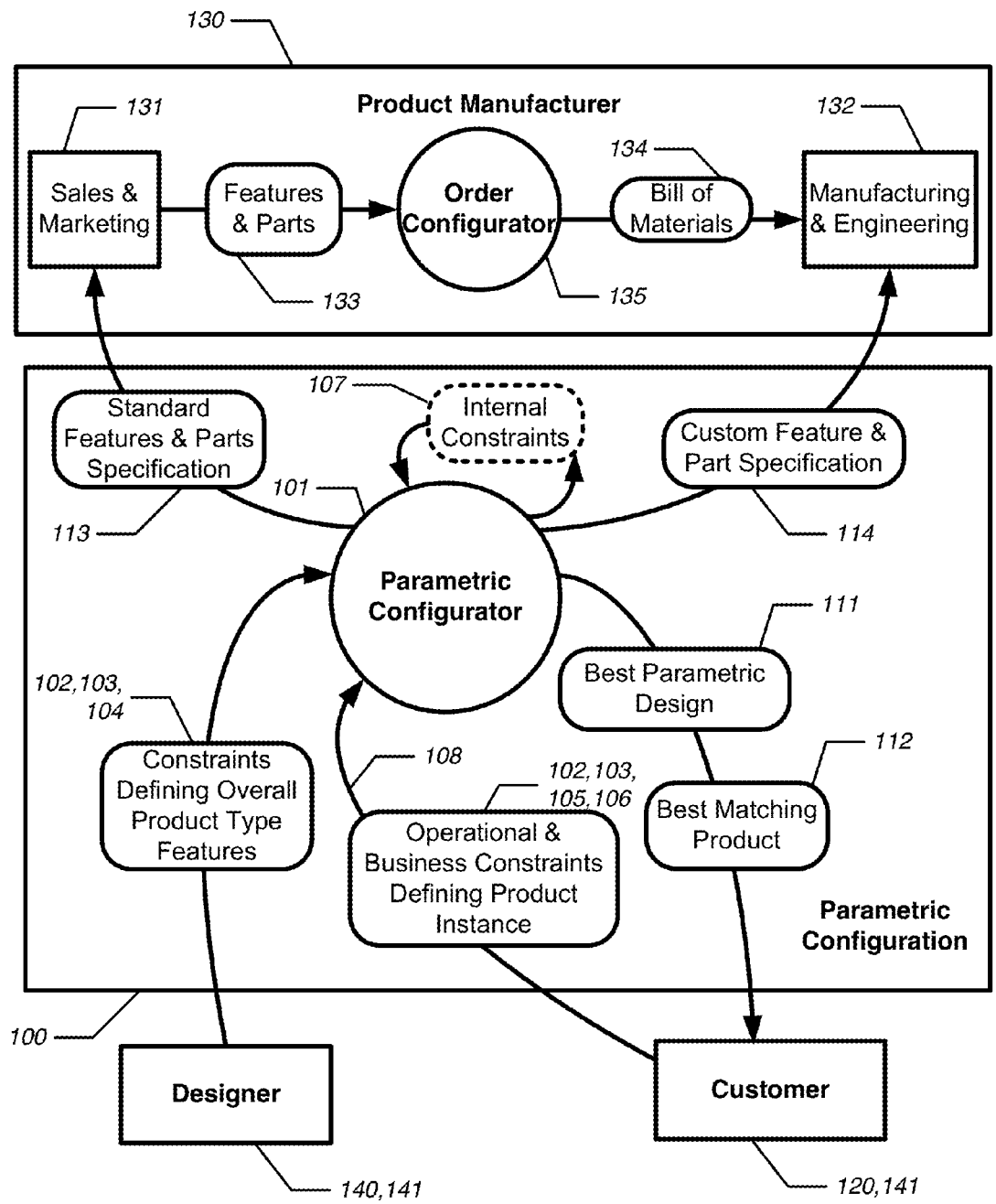
FIG. 1 is a schematic drawing outlining a system and process of parametric configuration.

This section and associated figures provide details of exemplary embodiments of the invention. Persons familiar with the art will realize that other embodiments are possible, and such embodiments should be regarded as within the scope of the present invention.

DEFINITIONS

The following definitions will be used in this application for terms related to various embodiment of the present invention. These definitions are not intended to limit the scope of the present invention, and are intended to be understood in light of common knowledge of one of ordinary skill in the art.

"Mass customization" refers to processes and systems that combine mass production functions and methods with individual customer customization during product design through rule-based constraints and extensive pre-engineering.

"Mass optimization" refers to an overall process and system used for creating a new product design at the point of sale, which not only meets customer requirements and minimum specifications, but also produces a design that is the optimal configuration for the customer requirements.

"Pre-engineering" is design and engineering of parts and assemblies that must take place before engineering and fabrication of a complete product can occur.

A "product configurator" is a product selector that makes it possible for customers to configure a product by adding or changing product characteristics based on a list of pre-engineered part numbers and feature codes. A product configurator cannot complete the overall product specification until all customer requirements are engineered first. Manufacturers of complex equipment usually allow customers to request unpublished features and parts. The customer must then wait until the requested features and parts are pre-engineered, so that the new features can be selected within the product configurator.

"Parametric configuration" refers to the process of generating an optimal product design, based on product specifications and customer requirements, by utilizing and factoring geometric, physical, technological, and scientific relationships of parts and features within the product, as well as the performance, engineering, legal, and business requirements. Unlike product configuration, parametric configuration does not delay the customer and the ordering of the product. Rather, it engineers the product while the customer is designing the product to customer requirements.

A "parametric configurator" is a product design and selection framework provided by embodiments of the present invention that makes it possible to create an optimal product design. This framework, which may be accessed through a set of computerized interfaces, enables the enhanced creation and development of a product design according to principles of parametric configuration.

A "parameter" is a variable, which is input to a parametric configurator, that affects the design of the product. Sometimes the term may refer to the value of such a variable.

A "constraint" is a limitation on the permissible value of one or more parameters, or on the relationship among a set of parameters.

A "customer" is the party that selects a custom product design which meets their requirements, and might later procure a finished custom product according to the design.

A "customer requirement" is a tangible or intangible characteristic of a product that is required in order to meet the customer needs and preferences. A customer may also impose its own set of geometric and physical constraints for the finished product as part of the customer requirements.

A "product manufacturer" is a party that builds a finished custom product from a selected custom product design. A product manufacturer may impose its own set of business, performance, geometric, physical, and other constraints on the finished product.

A "manufacturer requirement" is a tangible or intangible characteristic of the product that is required in order to meet a product manufacturer's capabilities. A manufacturer may also impose its own set of geometric and physical constraints for the finished product as part of a manufacturer requirement. A manufacturer may also impose its own business requirements; for example, engine X can only be purchased as a component of a truck Y.

A "part manufacturer" is a party that builds a component of a finished product. The part manufacturer may impose its own set of business, performance, geometric, and physical constraints on the usage of part in the finished product. A part manufacturer can also be the product manufacturer.

A "legal requirement" is a tangible or intangible characteristic of a product that is required in order to satisfy government requirements, arising from any level of government.

A "product" is a defined item with specific characteristics, assembled, manufactured, or fabricated from a set of parts, with a specific layout according to a defined product design.

A "product design" is a list of characteristics, parts, part designs, and part relationships, where the relationships can be geometric, physical, or intangible. When parts have internal structure, the product specification may also include the internal design of the parts. The parts in combination provide characteristics required by the customer, manufacturer, and private and public organizations.

A "part" is an individual component of a product that may be selected to be assembled into the product, and may be substituted or removed from the product design based on the required characteristics. A manufacturer designates a part by a part number. A part number list does not completely specify a product. For example, seat layout of a bus cannot be captured as a part number if the customer is free to specify the seat layout. The seat layout may be viewed as a characteristic that is derived from the seat parts, other bus parts and characteristics, and from the customer layout requirements. A part can have internal characteristics. For example, an engine has electronic engine parameters that are used to configure the engine electronics. Usually an engine part number only refers to the engine type, but not the specific physical engine that can be programmed into many electronic configurations.

A "feature" is a tangible or intangible characteristic of a product that is a consequence of a part or a combination of parts, as well the environment in which product operates. For example, top speed is a feature that is a consequence of engine, rear axle, cab surface area, transmission, and tires, as well as load, road condition, and temperature. Color is a feature of a cab. The distinction between a part and feature is not always clearly defined by the manufacturers. For example, cab color may be assigned a part number. The designator for a part, an alphanumeric string, is usually called a part number; the designator for a feature, also an alphanumeric string, is usually called a feature code. Part numbers and feature codes are specific to a manufacturer, although the associated parts or features might not be. For example, top speed (a feature) or a rear axle (a part) may be designated with different identifiers by different manufacturers.

A "bill of materials" is the list of manufacturing parts and instructions for assembling a product. A bill of materials is derived from the part and feature list that completely defines a product. For example, the bill of materials for a bus includes the seat part numbers and their locations. A bill of materials for the electrical panel of a fire truck includes the part numbers for the switches, their custom layout in the panel, and their connection to instruments they activate. Seat layout and panel layout are common examples of the complete failure of the product configurator, pre-engineering, approach to manufacturing. Neither the panel layout nor the seat layout can be pre-engineered without limiting the customer to very specific layouts.

"Geometric characteristics" comprise surfaces, curves, lines, planes, vectors, points, and other geometric entities.

"Geometric constraints" limit a product layout based on geometric characteristics. Geometric constraints include, for example, volume, surface area, length, coincidence, tangency, angle, distance, parallelism, and perpendicularity.

"Physical characteristics" specify physical constraints on a product. Examples of physical characteristics are time, length, energy, power, force, torque, speed, accelerations, mass, moment of inertia, center of mass, linear momentum, angular momentum, electric field magnetic field, and entities that can be expressed in terms of such characteristics.

"Minimum specifications" are a set of requirements that must be met by a product design. For example, the SAE J2188 specification provides detailed guidelines for standardized vehicle performance evaluation and recommended performance requirements. The Federal Motor Vehicle Safety Standards and Regulations (FMVSS) are safety specifications required by law in the United States.

Product Design with a Parametric Configuration Process
Overview

Product configurators are commonly perceived as the ultimate tool for configuring a product that meets customer requirements. But product configurators are not capable of answering the most important customer question: is the product truly the best product for the customer? Identifying a product that is optimized to customer requirements is beyond the capabilities of product configurators, which only enable a customer to select pre-designed features and parts of pre-engineered products from a single manufacturer. It is ultimately the customer's problem to ensure that the product is acceptable.

Embodiments of the present invention enable the customer to create a best design for the customer requirements, and to match the best design to concrete product offerings from multiple manufacturers. The following disclosure explains how complex products may be optimized at the point of sale and without manufacturer specific features and parts, using methods and systems implementing parametric configuration according to various aspects of the present invention. In operation, parametric configuration is capable of optimizing the product design for extremely complex products. The present disclosure describes the process of designing complex products with the non-limiting example of ground vehicle design, and more specifically, the selection and design of integral components of the product design, including a heavy duty truck driveline.

FIG. 1 provides a high-level overview of the various parties and relationships involved in a product design and manufacturing scenario that uses parametric configuration 100. Arrows, typified by arrow 108, indicate flow of information. Design by parametric configuration 100 is governed by constraints 102, which may be provided by users 141 or generated internally during the process. These will be referred to as external constraints 103 and internal constraints 107 (shown dashed in FIG. 1), respectively. The classes of users 141 most important to parametric configuration 100 are customers 120 and product designers 140. Designers 140 specify product type constraints 104 that define the class of product, whether it be a computer or a bulldozer. For example, a typical bulldozer will have, among other things, an engine, two tracks, and a blade. These component types, the number of each type, and their geometric relationship to each other are standard for a bulldozer. These basic constraints 102 are characteristic bulldozer product type constraints 104 that might specified by a designer 140.

A customer 120 might want a particular instance of the bulldozer type that has certain characteristics and functionality. For example, the blade might need to have a certain width and height; the engine, a minimum power; and so forth. These are examples of product instance constraints 105. Among the product instance constraints 105 that a customer 120 will generally want to specify are operational and business constraints 106. As depicted in FIG. 1, a customer 120 is able to directly provide its requirements in the form of constraints 102 to the parametric configurator 101 without necessarily referencing any specific feature codes and part numbers of any product manufacturer.

A parametric configurator 101 designs a product that satisfies all the external constraints 103, as well as any internal constraints 107 which are automatically generated during the design process. In a typical embodiment, the parametric configurator 101 will apply criteria for optimality, so that what is returned to the customer 120 by the parametric configurator 101 is the best parametric design 111 expressed in terms of product parameters, and the best matching product 112 of the best parametric design 111 as a set of manufacturer 130 specific part numbers and feature codes. A customer 120 may decide to request realizations of the best design from multiple product manufacturers 130. The parametric configurator 101 creates as many concrete realizations by any number of manufacturers 130 of the best design as requested by the customer 120, and then ranks the realizations of the best design for the customer 120 review for the purpose of selecting a manufacturer 130.

A sales and marketing group 131 of a product manufacturer 130 will typically have established a set of features and parts 133 that are offered within a manufacturer product design. A manufacturing and engineering group 132 of product manufacturer 130 requires a valid bill of materials 134 in order to assemble the product design into a concrete product. These distinct processes are integrated into a new product design through a parametric configuration 100 process, implemented by a parametric configurator 101. The parametric configurator 101 is able to create an optimal design and subsequently select the product manufacturer feature codes and part numbers that realize the optimal product design. In cases where a part and related bill of materials 134 does not exist, parametric configurator 101 creates a standard features and parts specification 113 for procurement and for documentation by the product manufacturer 130. The features and parts 133 are ultimately translated into a bill of materials 134 by the manufacturer's order configurator 135. A custom features and parts specification 114, based on the best parametric design 111 from the parametric configurator 101, will be combined by the manufacturing and engineering group 132 into a best matching product 112 for the customer 120.

Parametric configuration 100 creates a design without the limitation of a single manufacturer that offers a set of pre-engineered features, parts, and designs. Currently, product configurators are created by the manufacturers for the sole purpose of selling their own products. In contrast, the parametric configuration 100 serves the customer by enabling the customer to design the best product without committing to a manufacturer and manufacturer limitations. Parametric configuration 100 may select a manufacturer 130, or select manufacturer 130 specific features and parts 133 after the design is created, if and when the customer 120 wishes to do so. Manufacturer features and parts 133 are an output of parametric configuration 100. A customer 120 may also limit the designs to certain manufacturer features and parts 133 if they wish to do so. Limiting design to certain manufacturer features and parts 133 is simply another set of constraints 102 imposed by the customer 120 on parametric configuration 100. When a best parametric design 111 requires new parts and a bill of materials 134 to be created by the manufacturing and engineering group 132 of the manufacturer 130, parametric configuration 100 creates a custom features and parts specification 114.

Figure 2A:
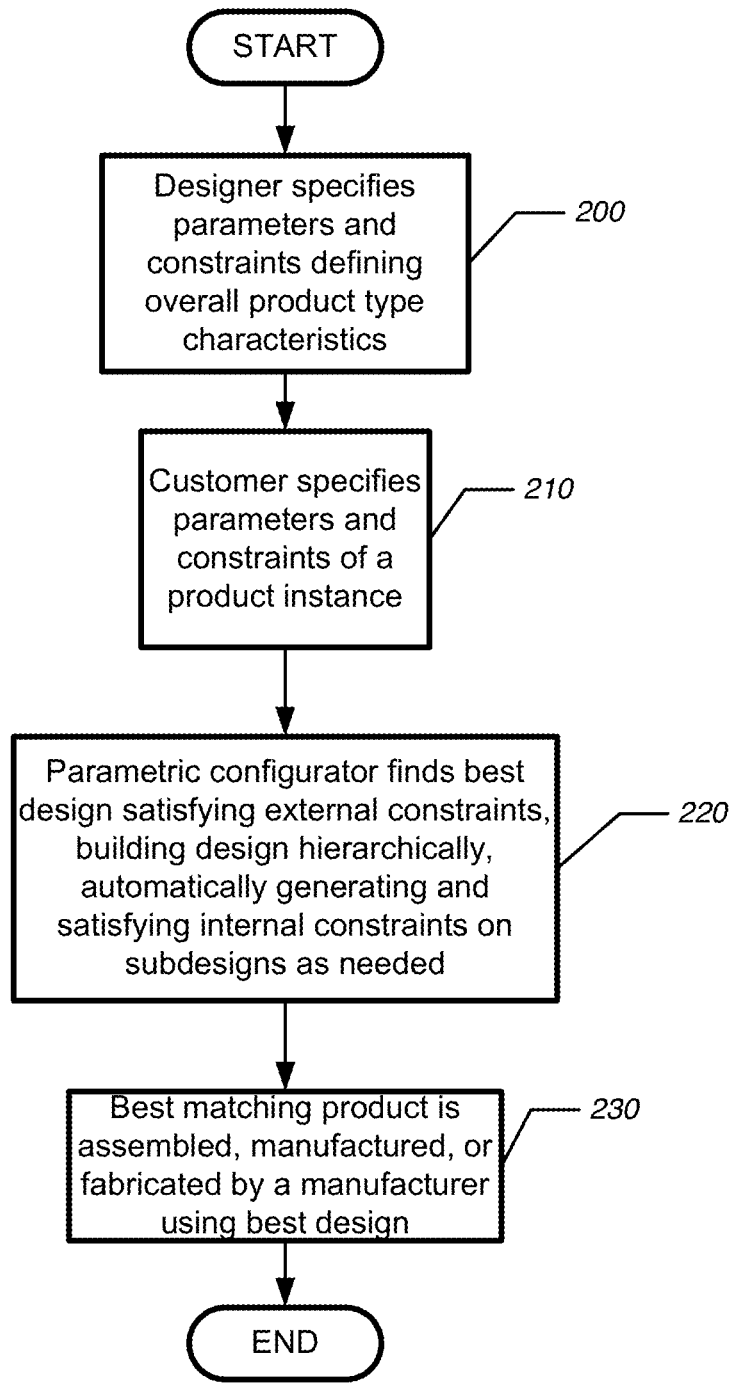
FIG. 2a is a flowchart illustrating exemplary phases of constraint specification in parametric configuration.

The role of constraints 102 in the various phases of the design and manufacturing process is summarized in FIG. 2a. In step 200, a designer 140 specifies product type constraints 104, defining the overall product type characteristics. In step 210, a customer 120 specifies the parameters and constraints of their particular instance of the product type. The parametric configurator 101 in step 220 finds the best design that satisfies both the external constraints 103 and any internal constraints 107 that arise automatically during parametric configuration 100. In some embodiments, the best matching product 112 is fabricated, manufactured, or assembled by a product manufacturer 130 for the customer 120. Note that some embodiments of the present invention do not require a model translation module to convert a configuration model into a constraint 102 satisfaction problem.

Figure 2B:
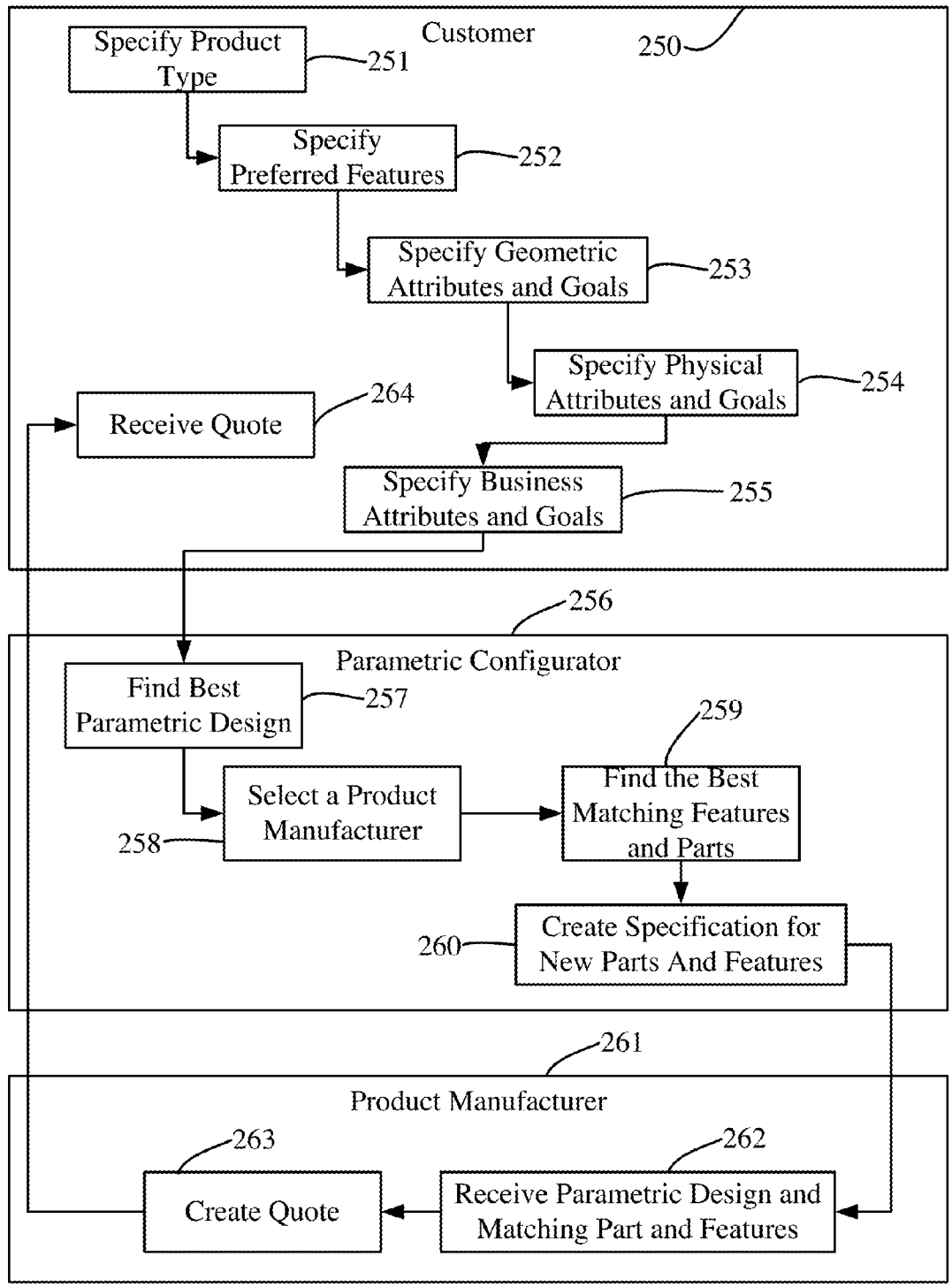
FIG. 2b is a flowchart of an exemplary process of parametric configuration, from specification of parameters through creation of a quote.

FIG. 2b, which assumes that the designers 140 have already completed the product type constraints 104 for the product, shows a typical process flow during a custom product design with a parametric configurator 101. A customer 120 selects a product type in step 251. For example, a product type may be truck or bus. In step 252, customer 120 specifies preferred features. A preferred feature may a manufacturer 130 of the engine, or an exact model of the transmission, or material for construction of the cab. In step 253, customer 120 specifies geometric attributes and goals. A geometric attribute might be overall truck dimensions, the location of a bus emergency door, or bus wheelbase. A geometric goal might be maximum bus seat capacity, maximum bus luggage volume, or clear areas on the truck frame for mounting the truck body. In step 254, customer 120 specifies physical attributes and goals. For example, physical attributes may be weight rating of truck axles, truck drive shaft torque rating, or maximum truck driveline joint angle. A physical goal may be to minimize total vehicle weight, maximize vehicle fuel efficiency, or to ensure that vehicle startability is greater than ten percent. In step 255, customer 120 specifies business characteristics and goals. For example, a business characteristic may be engine warranty, or operational cost, or residual value. A business goal may be a certain trade-in value, or concessions percent, or financing interest rate. In step 257, parametric configurator 101 finds the best design subject to the constraints and goals set in step 251 through step 255. In step 258, a manufacturer 130 is selected. In step 259, parametric configurator 101 finds the best matching parts and features from this manufacturer 130 to build a truck instance that has a design that is closest to the best parametric design 111 found in step 257. When matching parts and features are not offered by product manufacturer 130, in step 260, the parametric configurator 101 creates a standard features and parts specification 113. A specification may be a list of intangible, geometric, and/or physical characteristics. For example, intangible characteristic may the required warranty. A geometric characteristic may be the truck drive shaft lengths and truck drive shaft angles. A physical characteristic may be the number of bus seats and their locations on the bus floor. In step 262, the manufacturer 130 receives the best design and the manufacturer 130 features and parts matched by the parametric configuration 100. In step 263, the manufacturer 130 creates a concrete specification for the best design and a quote for the concrete design. In step 264, the customer 120 receives the quote from the manufacturer 130 for a truck instance that matches the best parametric design 111.

User Specification of Instance Constraints

A parametric configurator 101 differs from a standard order configurator 135 in the capability of a parametric configurator 101 to work with purely parametric data and, when concrete candidate parts exist, to work with multiple candidate parts. A comparison of exemplary user interfaces 300 for configuration of a truck in FIG. 3a and FIG. 3b illustrates this important distinction.

Figure 3A:
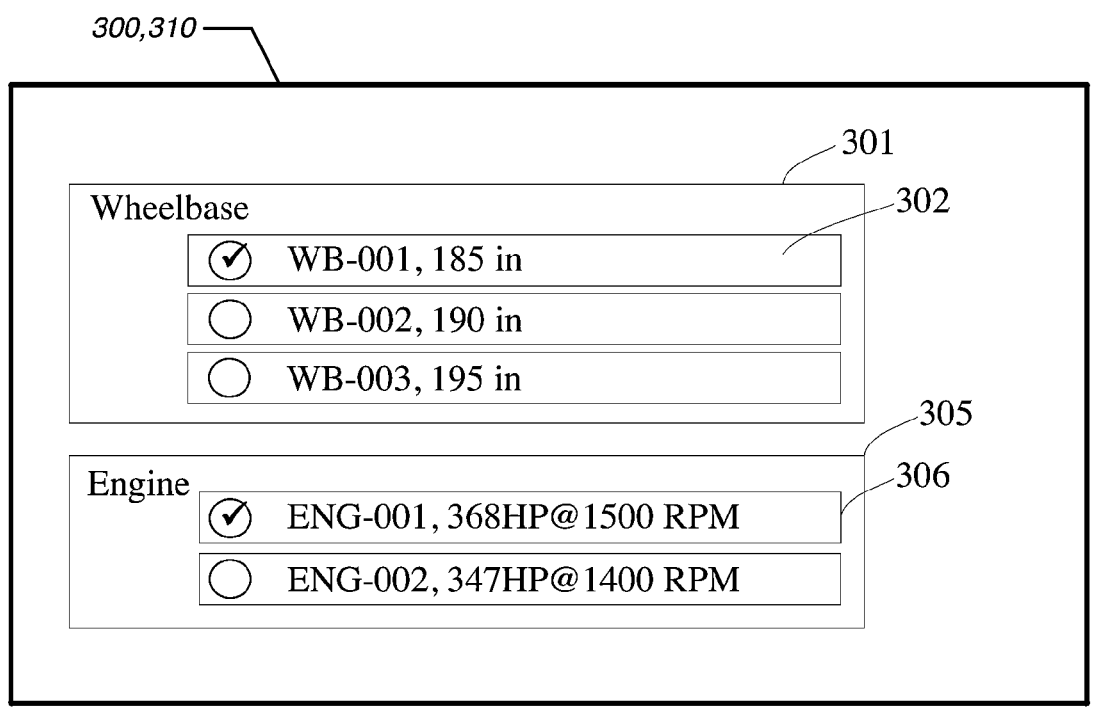
FIG. 3a is an exemplary form whereby a customer might specify a configuration by part numbers for order/product configuration.

FIG. 3a illustrates an order configuration user interface 310. A customer 120 may select a Wheelbase 301 from a list of those available, such as WB-001, WB-002, and WB-003. The customer 120 may choose only one Wheelbase 301, such as WB-001 302. The customer also selects a single Engine 305 from a list of those available. The order configurator 135 allows a customer 120 to have a single Engine 305, such as ENG-001 306.

In a commercial truck, the customer 120 may select many more features and parts, for example, tires, axles, warranty, application, and transmission. The procedure is simply repeated for each family of choices. When all features are selected, the customer has specified a truck instance. Specifying multiple engines, transmissions, or rear axles to an order configurator 135 is considered an error. If a customer 120 is not sure which combination of engine, wheelbase, rear axle, and transmission will satisfy their requirements, the customer 120 has to experiment by designing trucks with all combinations, and check the configured truck for each combination. The overall fit of the truck to customer 120 requirements is determined after the fact; after the truck design is completed. The customer 120 may try a limited number of trucks to improve the fit of the truck, but finding the optimal truck is prohibitively time consuming due to trial and error approach that is inherit in the standard order configuration user interface 310.

The parametric configurator 101 allows the customer 120 to select multiple candidate instances for a parameter. For example, the customer 120 may specify that all engines with 400 to 420 HP are acceptable. The parametric configurator 101, through its search and optimization capability, identifies the best engine after creating the best parametric design 111 for customer 120 specifications. The customer 120 requirement for the horsepower range will become a constraint on a parametric configuration search, described below in connection with FIG. 10 and FIG. 11, for the best parametric design 111.

As mentioned previously, another limitation of standard configurators is the requirement that the customer 120 should select a part number or feature code. FIG. 3b illustrates another user interface 300, the parametric configuration user interface 320. The parametric configuration user interface 320 allows a customer 120 to search for a part number or feature code by constraints 102. For example, the customer 120 may be interested only in red seats from a specific manufacturer 130. In that case, the customer 120 only specifies the color and manufacturer 130 of the seat, but not the seat itself. The customer 120 may further restrict the candidate seat parts by selecting a subset from the list of red seats made by the specified manufacturer 130.

Parametric configuration 100 finds the best parametric design 111 that is consistent with the constraints. For example, the customer 120 might set a range for the top speed 324. The customer 120 might also set gradeability 325 requirements. As opposed to an engine or a transmission, top speed 324 and gradeability 325 are not manufactured; they cannot be represented by parts numbers or a bill of materials 134. Similarly, the customer 120 specifies the wheelbase 326 as a range, as opposed to selecting a pre-engineered wheelbase. Although the requirements for the top speed 324 and gradeability 325 impact the selection of engine 327 for the best parametric design 111, the customer 120 may further limit the choices. As shown in the figure, the customer 120 might choose a range of engine power 328, select a couple of preferred engine manufacturers 330, and might even specify a particular engine model 329. The customer 120 might specify particular driveline parameters 331, such as a range of joint angles and a range in the number of driveshafts. None of the customer 120 requirements of FIG. 3b are meaningful in systems that process orders because they are not priced, purchased, or manufactured as part of single truck. An order configurator 135 simply inherits the limitations of the order processing system of a particular manufacturer 130 by forcing the customer 120 always to uniquely specify a product and assume the responsibility to ensure the fit and goodness. Parametric configuration, on the other hand, allows the customer 120 to specify requirements and let the parametric configurator 101 find the best matching product without any limitation of the order processing system of a particular manufacturer 130.

The intangible nature of the customer 120 requirements is the fundamental reason for the failure of order configurators 135 to configure a truck from requirements. Designing a truck to the parametric requirements of FIG. 3b requires search and optimization based on physics and geometry of trucks. Such geometry and physics cannot be represented by rules. Rules and rule-based configurators are not capable of any search and optimization. Standard order configurators 135 are designed to configure products ranging from custom trucks to custom sandwiches. Standard configurators are obviously capable of configuration only to the extent that configuration methods do not depend on the differences between a truck and a sandwich.

A further advantage of the parametric configurator 101 is its ability to work with a list of parameters. For example, a bus has a list of left side seats and right side seats. A parametric model 420 of the bus would have left seat and right seat parameters that refer to a collection of seats. A customer 120 can add or delete seats from the lists of left seats and right seats. Furthermore, there will be only one parametric model 420 of a seat regardless of the quantity, orientation, and location. Through its language, parametric configurator 101 allows arbitrary requirements to be added to the lists of left seats and right seats as a whole, or to each individual member of the seat collection. Furthermore, through its parametric configuration user interface 320, the parametric configurator 101 allows each member of the left seats set and right seats set to be configured individually. Through a parametric geometric solver 405, the parametric configurator 101 layouts the seats, and create a details specification of its layout. Standard order configurators 135 are not capable of configuring collections of features and parts.

Parametric Configuration

Figure 4:
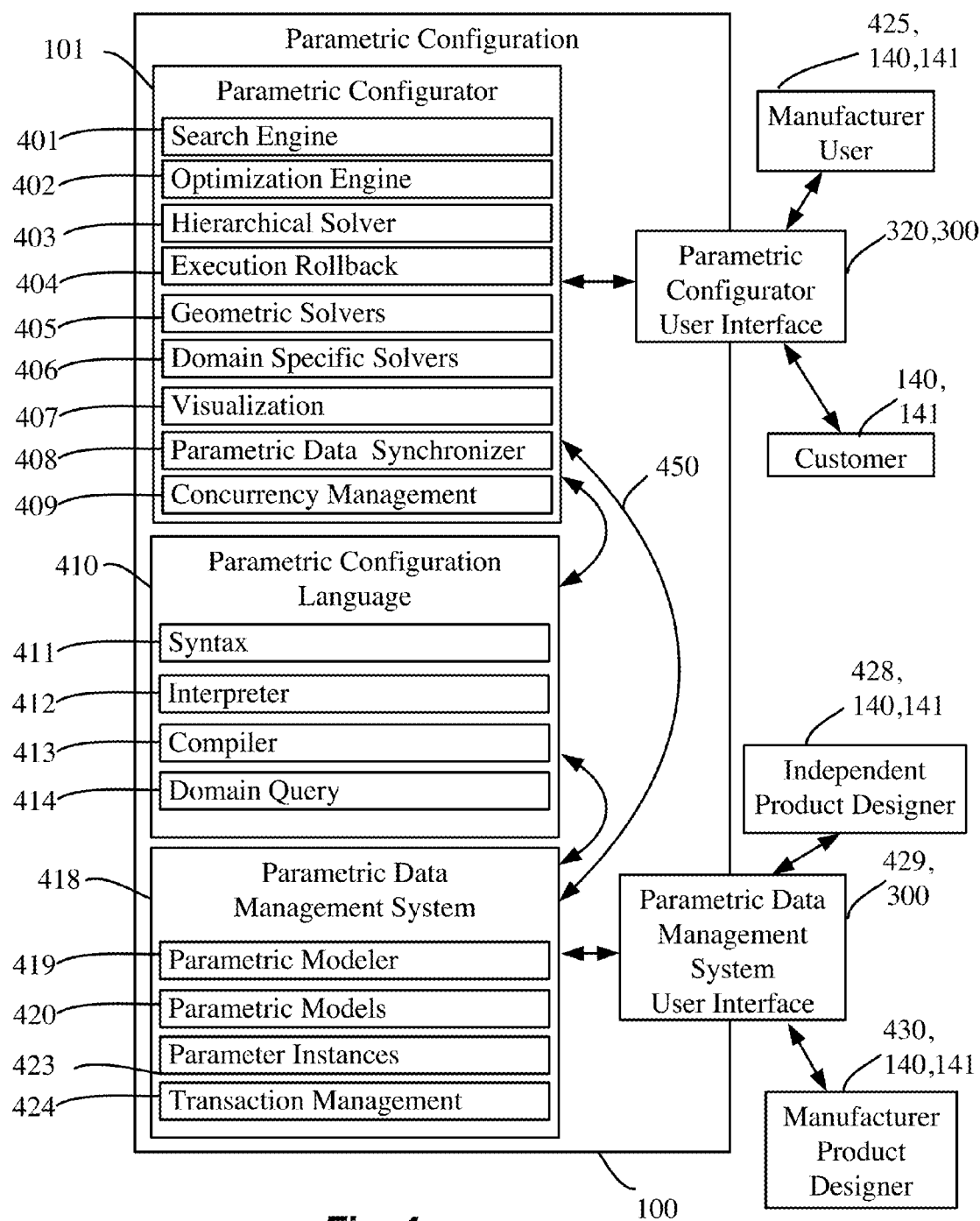
FIG. 4 is a schematic diagram showing components of an exemplary implementation of parametric configuration.

FIG. 4 is a block diagram of a particular implementation of a system for parametric configuration 100. In this implementation, parametric configuration 100 typically comprises a parametric configurator 101, a parametric configuration language 410, a parametric data management system 418, a parametric configuration user interface 320, and a parametric data management system user interface 429, although not all these elements need be present in every embodiment. Pathways for information exchange are indicated by arrows in the figure, typified by arrow 450. These communication pathways can be implemented with any of the technologies for digital information exchange known in the art, such as networks, wired or wireless transmission technologies, and busses, either alone or in combination.

Users 141 of parametric configuration 100, such as manufacturer user 425, customer 120, independent product designer 428, and manufacturer product designer 430, interact with the parametric configurator 101 and parametric data management system 418 with the use of parametric configuration user interface 320 and parametric data management system user interface 429, respectively. An example of a parametric configuration user interface 320 is shown in FIG. 3b. Manufacturer users 425 include any person or organization that is authorized to sell manufacturer products; the dealers, the dealer sales persons, persons working for manufacturer sales, marketing and engineering departments. Customers 120 include individuals, organizations, and persons working for organizations that seek to purchase a product. An independent product designer 428 is an individual or organization that is not a manufacturer user 425. A manufacturer product designer 430 is also a manufacturer user 425. Independent product designers 428 and manufacturer product designers 430 create parametric models 420 and parametric instances 423 of products, features, and parts.

Parametric Data Management System

The parametric data management system 418 in the embodiment shown in FIG. 4 includes a parametric modeler 419, parametric models 420, parametric instances 423, and transaction management 424 functionality, which are supported by the domain query 414 capability of parametric configuration language 410.

The parametric modeler 419 enables independent product designers 428 and manufacturer product designers 430 to design parametric models 420 of features, parts, and products. A parametric model 420 specifies parameters and constraints defining overall product type characteristics (see FIG. 2a). The parametric configurator 101 works with parametric models 420, features, parts, and products. Parametric modeler 419 also enables any user 141, including manufacturer users 425, customers 120, independent product designers 428, and manufacturer product designers 430, to create parametric instances 423.

The parametric data management system 418 can have a large number of users 141 concurrently working on the same product design. Transaction management 424 ensures that multiple users 141 can create parametric models 420 and parametric instances 423 without disrupting parametric configuration 100 and without corrupting its integrity. Transaction management 424 enables users 141 to experiment with parametric models 420 and parametric instances 423 without committing the changes.

Parametric Models and Parametric Model Instances

Parametric configuration 100 represents products in parametric form, created by independent product designers 428 and manufacturer product designers 430, which parameterizes the product features, physical characteristics, geometric characteristics, and relationships between features, and characteristics. Parameterization refers to representations of a product and its features by a set of vendor neutral parameters that are independent of any manufacturer's designs, feature codes and part numbers. The result of parameterization is a parametric model 420 of a product. A parameter instance 423 of a product is an instance of a parametric model 420, where each parameter is assigned a concrete value. A parametric model 420 may not require all parameters to be assigned a value before it describes a concrete product. For example, a parametric model 420 of a truck might include a parametric model 420 of a manual transmission and a parametric model 420 of an automatic transmission. A truck instance may have either the manual transmission or automatic but not both. On the other hand, a truck must have one and only one engine before it can be considered a truck instance. A parametric model 420 may have integrity and completeness checks defined as another set of constraints on the parametric model 420. As will be discussed below, a parametric model 420 is represented in parametric configuration language 410.

Figures 5E, 5F, 5G:
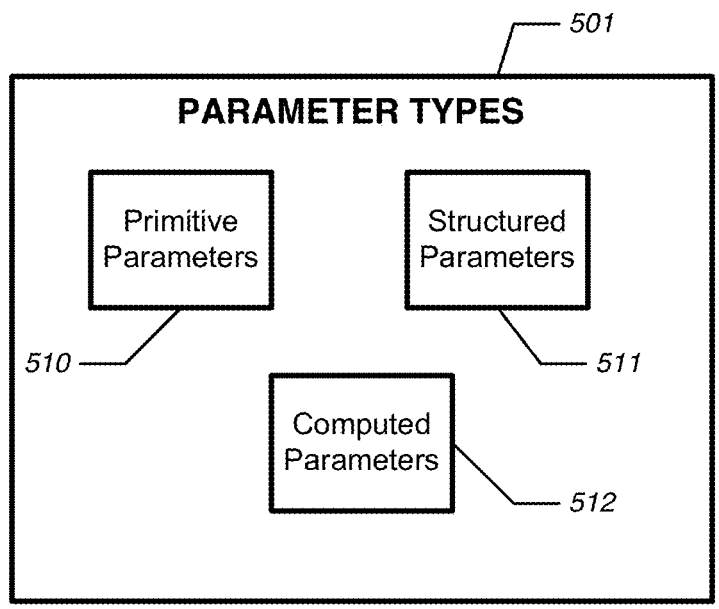
FIG. 5e is a table illustrating exemplary power curve parameters and their types.
FIG. 5f is a table illustrating exemplary power curve parameters and their values.
FIG. 5g is a schematic diagram showing parameter types.

A parametric model 420 is a set of parameter type 501 declarations expressed in syntax 411. As shown in FIG. 5g, the parametric configuration language 410 includes three types of parameters 500: primitive parameters 510, structured parameters 511, and computed parameters 512. The tables of FIG. 5a through FIG. 5f provide examples of parameters 500, parameter types 501, and parameter values 502. In these figures, some repetitive reference numbers have been omitted for clarity.

A primitive parameter 510 has no further detail. For example, in a vehicle product design, weight, length, and color of the vehicle body are primitive parameters 510. A parameter instance 423 is created by assigning a String, a Number, or a Boolean value to the parameter. Other types of primitive parameters 510 can be constructed from String, Number, and Boolean type parameters.

A structured parameter 511 is a parameter 500, having details that are expressed by child characteristics which are modeled as child parameters 504. For example, in a vehicle product design, engine, transmission, torque converter, and rear axle components are modeled as structured parameters 511. The details of a transmission include its gears, its manufacturer 130, its torque rating. A gear is also a structured parameter 511 whose child parameters 504 include the gear label and the gear ratio. A structured parameter 511 is assigned a value when all child parameters 504 are assigned values, thereby creating a parameter instance 423 of the structured parameter 511.

A computed parameter 512 is derived from other parameters 500. A computed parameter 512 can be declared as a function that when executed returns the computed value of the parameter 500. A computed parameter 512 can be a primitive parameter 510 whose parameter value 502 is assigned by an expression. A computed parameter 512 may take arguments and its execution may depend on the other parameters 500. Top speed of a vehicle is a computed parameter 512 of a vehicle. Its computation depends on the engine, transmission, rear axle, rear tire, and environment of vehicle. Computed parameters 512 are often used in expressing constraints 102. For example, a customer 120 can require a top speed of 70 miles per hour, while a manufacturer 130 might require that maximum rear axle torque be less than the torque rating of the rear axle. While rear axle rating is a primitive parameter 510 of the rear axle, the maximum rear axle torque of the vehicle is computed from engine, transmission and other driveline components.

A computed parameter 512 of a parametric model 420 may be an expression that applies to all parametric instances 423 of a parameter type 501 or it may be defined for each parameter instance 423 of a parameter type 501 individually. For example, a parametric model 420 may be a condition-action rule that has a condition and action defined as computed parameters 512. The condition and action will be implemented as computed parameters 512 whose exact expression can differ from one rule instance to another. In object oriented languages like Java, a class is analogous a parametric model 420, and an object is analogous to a parameter instance 423. A class method is analogous to computed parameter 512 of parametric configuration 100. Unlike object oriented languages, parametric configuration 100 allows a different computed parameter 512 expression for each parameter instance 423.

A structured parameter 511 may have structured child parameters 504. When an instance of a structured parameter 511 has a structured child parameter 504, the child parameter 504 is included by reference. The Name 521 parameter of a parameter instance 423 of a structured parameter 511 is the reference to the instance. The parametric configurator 101, parametric modeler 419, and parametric data management system 418 use the Name 521 child parameter value to refer to a structured parameter instance. The ability to refer to a parameter instance 423 by its Name 521 parameter enables the product designer 140 to create relationships between parametric instances 423 without knowing how and from where the parametric instances 423 are fetched.

A typical ground vehicle performance parameter 500 is environment. The Environment 520 parameter depicted in FIG. 5a is the type declaration for the parametric instances 423 of Environment 520. Environment 520 is a parent parameter 503 that contains a number of child parameters 504 which define its characteristics that are relevant to a ground vehicle. Environment 520 is a structured parameter 511, while Name 521 and the other child parameters 504 of Environment 520 are all primitive parameters 510. Name 521 has the parameter type 501 of String 522. A parameter instance 423 of Environment 520 is a collection of child parameter values 502. FIG. 5b depicts an instance of Environment 520, since all its child parameters 504 have been assigned values. It specifies the exact list of the child characteristics that an environment instance must have. In particular, the parameter value 502 of this parameter instance 423 of Name 521 is Minnesota 523.

The environment specification is essential to the design of a ground vehicle. Parametric configuration 100 can fully factor the environment into product design because it can design and optimize a ground vehicle from its parametric representation, and subsequently find the matching features and parts. Environment and tangible features like engine are both modeled as parameters. In an order configurator 135, on the other hand, environment is never represented as a part number or feature. Manufacturer can neither sell an environment nor procure an environment. An order configurator 135 is designed to sell features and parts from the particular manufacturer 130, in terms of which a product is modeled. Therefore, an order configurator 135 can only check the sufficiency of the product design for customer 120 requirements after all parts and features are selected.

In ground vehicle parametric design, an engine is a common part that may be parameterized. The table shown in FIG. 5c, lists the declaration of the parameter type 501 for an Engine 530. Parametric configuration 100 allows any arbitrary number of parameters 500 and child parameters 504. In addition, a parameter 500 can be a collection of primitive parameters 510 or structured parameters 511. Parametric configuration 100 does not require collections to have a declared number of items. For example, the declaration of a structured parameter 511 type, PowerCurve 540, is shown in FIG. 5e. A PowerCurve 540 has Power Values 542 and RPM Values 543, each of which is declared to be a List 541. A PowerCurve 540 can have any number of rpm and horsepower pairs. After a parameter instance 423 of PowerCurve 540 has been created with the use of parametric modeler 419, parametric configuration 100 can refer it by its Name 521. For example, the power curve PC0012 544 is defined in FIG. 5f as a parameter instance 423 of PowerCurve 540. Engine 530 has a child parameter 504 that is named PowerCurve 540. In the engine instance EHD2100 545, shown in FIG. 5d, the child parameter 546 is assigned the power curve PC0012 by its Name 521. Parametric configuration 100 can assign a parameter instance 423 of a structured parameter 511 by simply referring to its Name 521.

Constraints

In general any parameter instance 423 can be referenced by a domain query 414 that is expressed in parametric configuration language 410. For example the following domain query 414 refers to a PowerCurve 540 instance whose name is PC0012:

PowerCurve[name=='PC0012']

The child parameters of the PowerCurve 540 can be referenced by nested queries. For example, the following query refers to the item whose index is "i" in the parameter collection RPM of PowerCurve 540 that is a child parameter of Engine 530 instance HD2100:

Engine[name=='HD2100'].Power Curve.RPM Values[i]

Parametric configuration 100 can limit the items in a collection parameter to a declared parameter type 501. For example, List<Number> defines a list of Number instances. In object oriented programming terms, parametric configuration language 410 parameters, including collections, are type safe. Type safety in parametric models 420 defined in parametric configuration language 410 can ensure the semantic integrity of constraints 102. For example, the following is not a valid constraint 102 because Engine 530 has no child parameter 504 named Elevation:

Engine.Elevation==1000

Parametric configuration 100 catches the above statement as an error, and notifies the parametric model designer immediately.

Parametric configuration 100 allows any parameter instance 423 to be referenced by any query constraint 102; a parametric configuration language 410 expression that evaluates to a true or false value. In general, there can be multiple parameter instances 423 matching a constraint 102. A parametric configuration language 410 expression for a constraint 102 will return all matching parameter instance 423.

Parametric configuration 100 can find a matching part or feature instance by creating a set of query constraints 102 from a computed parametric design and by searching the existing part and feature instances with the generated query constraints 102.

Constraints 102 enable a customer 120 to design a product by specifying requirements, where a requirement may be a characteristic of a product feature or product part; or it may be geometric or physical relationships between product parts and product features. Parametric configuration 100 ensures that the requirements expressed as constraints 102 on the product design are satisfied independently of the matching concrete features and matching concrete parts of the designed product. Parametric configuration 100 finds the best parametric design 111 that satisfies all constraints 102 imposed by the customer 120, manufacturer 130, and designers 140. When there are a plurality of designs that satisfy all constraints, parametric configuration 100 ranks the designs using a goodness measure specified by the customer 120.

Typical geometric constraints 102 include volume limits, surface limits, length limits, coincidence, angle, distance, parallelism, and perpendicularity. Typical physical constraints 102 includes torque rating, force rating, linear and angular speed constraints, vibration amplitude limits, and power and energy usage. Depending on the type of product, there might be other kinds of technological or scientific constraints 102 as well.

Constraints 102 enable a customer 120 to specify the requirements without committing to how to procure and build such a product. Parametric configuration 100 with its constraint 102 solving capabilities finds the best design that meets customer 120 requirements. For example, a customer 120 can require maximum seat capacity for a bus and maximum luggage space under the chassis 904. A bus manufacturer 130 specifies additional constraints on the available bus design. For example, a bus manufacturer requires a minimum distance between any two components under the chassis 904. The federal regulations require a minimum distance between any two seats 912. Parametric configuration 100 finds a best parametric design 111 for the bus that meets the entire set of requirements: maximum seat capacity, maximum luggage area, sufficient clearance between seats 912 and between components.

Assembly Geometric Model

Parametric models with geometrical parameters enable product design in terms of physical dimensions, orientations, and characteristics. Geometric parameters are often used in spatial layout and optimization. Geometric parameters comprise surfaces, curves, lines, planes, vectors, points, and other geometric entities, from which a product layout can be derived by using constraints 102 and optimization goals. Those skilled in the art would recognize that many types of computations are possible through the calculation and use of geometric entities within a parametric configuration.

As an example, three widely used geometric entities used in parametric configuration 100 are point, plane, and vector. Parametric configuration 100 can layout and optimize purely geometric characteristics as well as parts that have geometric entities modeled as child parameters 504. For example, a driveline shaft parametric model 420 includes its length, a vector representing its orientation, and a point representing its location.

In manufacturing, a part or an assembly usually refers to a concrete item that has a CAD drawing, detailed specifications, and installation instructions. A part usually refers to an assembly that has no child assembly. Parametric configuration 100 designs the optimal product from the available parts and assemblies that may actually exist physically or from the parts and assemblies that are feasible to manufacture. For example, a driveshaft center bearing bracket is parameterized by its length and centerline angle (see FIG. 14). Parametric configuration 100 may limit the length and angle parameter instances to length and angles values of available concrete brackets. In other cases, length and angles are computed for optimal design and a matching bracket is found and manufactured after a design is selected by the customer 120.

Figure 6:
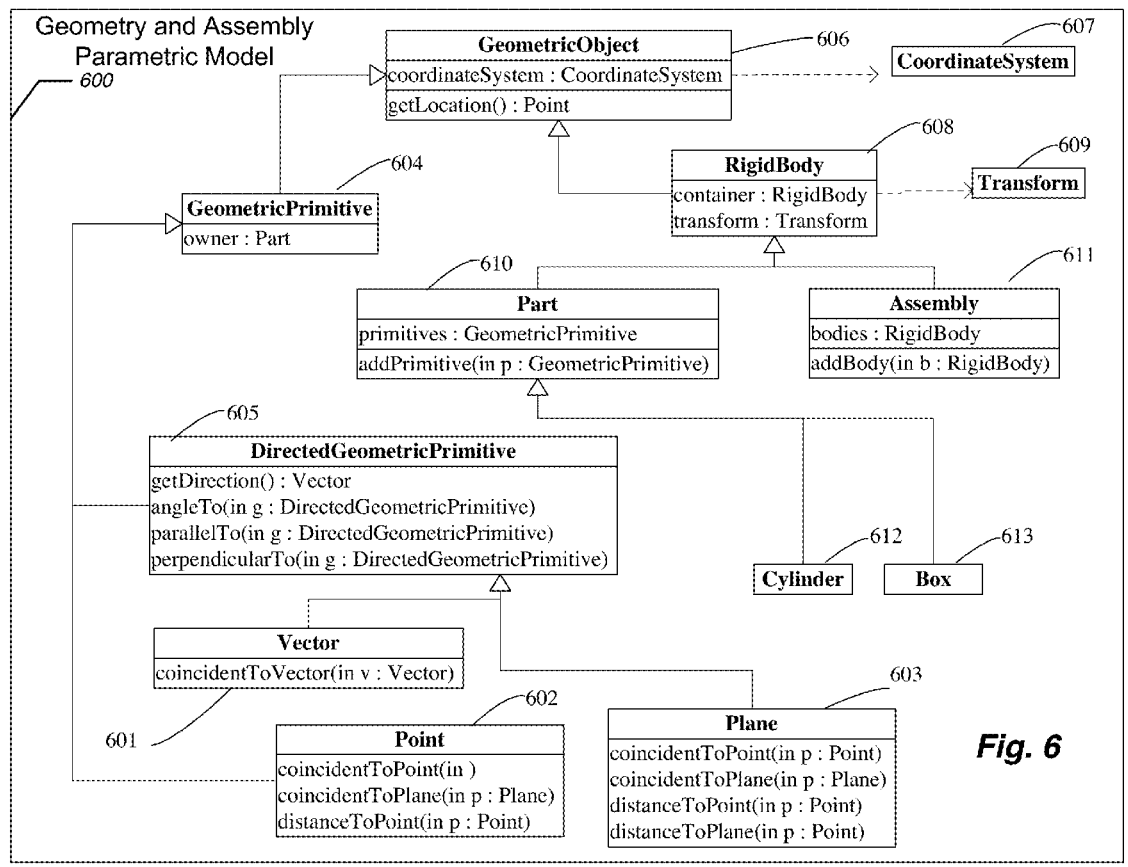
FIG. 6 is a Unified Modeling Language class diagram illustrating a Geometry and Assembly Parametric Model, including a GeometricObject class and related classes.

Parametric configuration 100 provides a parametric model for assemblies and parts. FIG. 6 shows the Assembly and Geometry Parametric Model 600 in Unified Modeling Language (UML). The primitives of the Assembly and Geometry Parametric Model 600 are Point 602, Vector 601, and Plane 603. The primitives are examples of Geometric Primitive 604 that must belong to a part. The owner of a Geometric Primitive 604 is a parameterized manufacturing part or an assembly. By itself a Geometric Primitive 604 does not represent any physical product part or feature, but it is a geometric characteristic of a product part, feature, or assembly. A Geometric Primitive 604 can be a Directed Geometric Primitive 605. Plane 603 and Vector 601 are Directed Geometric Primitives 605, while Point 602 is not. A Geometric Primitive 604 is a Geometric Object 606.

A Geometric Object 606 captures the basic characteristics of a physical part or feature of a product: its location and orientation specified in a Coordinate System 607. When parametric configuration 100 creates a design, all instances of Geometric Object 606 in the product design are assigned a location and orientation.

A Geometric Object 606 can represent both rigid and non-rigid bodies. For example, a truck engine is a rigid body while a truck suspension is not. The suspension geometry can depend on the load of the truck. Rigid Body 608 represents the geometry of features and parts that can be treated as rigid for parametric design purposes. For example, suspension geometry varies under different articulations. For driveshaft optimization, suspension can be modeled as a rigid body at a given axle articulation. An instance of a rigid body in the product is positioned and oriented by the parametric configuration 100 when product is designed. An instance of parameter Rigid Body 608 is computed and assigned to the Transform 609 parameter of each instance of Rigid Body 608 in the best parametric design 111.

Parametric configuration 100 provides two parameters 500 that are analogous to the part and assembly in manufacturing. Both Part 610 and Assembly 611 are declared as extensions to Rigid Body 608. In manufacturing, the distinction between a part and an assembly is not rigorously defined. Parametric configuration 100 defines a Part 610 instance as an assembly of only Geometric Primitive 604 objects, while Assembly 611 can include both Part 610 instances and Assembly 611 instances. For convenience, parametric configuration 100 defines two special part parameters: Box 613 and Cylinder 612. Box 613 is a generic part that can be placed anywhere to ensure that the bounded space is clear, or to create a simple model of a part. Many product parts can be modeled as a parameter instance 423 of Box 613. The parametric Box 613 does not distinguish among the exact details of an object, which as a practical matter in a given context, can be represented by a box.

Assembly parametric model is analogous to assembly in manufacturing and engineering. But the purpose and details differs significantly. Standard assemblies are designed to manufacture and install the assembly. In parametric configuration 100, Assembly 611 is designed for search and optimization of a product design. When an Assembly 611 is parameterized, only those geometric characteristics that are relevant to product design are retained or added. For example, a driveshaft center bearing is represented as a Box 613 and parameters that capture the relationship between a center bearing and driveshaft yoke are added.

Parametric configuration creates a best layout design by arranging Part 610 instances and Assembly 611 instances in a hierarchical sequence. When an instance of Assembly 611 has child instances of Assembly 611 and child instances of Part 610, each child is arranged to its final internal layout. Then child assemblies and parts are laid out rigidly to create the layout of the parent assembly.

Parametric Configuration Language

Parametric configuration language 410 includes a syntax for communication by users 141 with either parametric configurator 101 or parametric data management system 418. In the embodiment shown in FIG. 4 the parametric configuration language 410 has a syntax 411, and includes an interpreter 412, a compiler 413, and domain query 414 functionality. The parametric configuration user interface 320 transforms customer 120 specified requirements into constraints 102 expressed in syntax 411. This parametric model 420 is compiled at runtime into an executable form by a compiler 413, which enforces the consistency and compliance of parametric models 420 and parametric instances 423 before they are saved and committed to parametric data management system 418. Parametric configuration language 410 provides access directly to the parametric data management system 418, implementing domain query 414. Compiled models 420 are executed by the interpreter 412, and control execution of the parametric configurator 101.

Parametric models 420 and parametric instances 423 are displayed in syntax 411 in the parametric modeler 419 that accepts parametric models 420 and parametric instances 423 from users 141 via parametric data management system user interface 429 and parametric configuration user interface 320. The user interfaces 300 hide the details of parametric configuration language 410, but all inputs from users 141 are converted to parametric configuration language 410 before they are submitted to parametric modeler 419 for integrity checks and persistent storage 2130. Expert users 141 can directly enter parametric models 420 and parametric instances 423 in syntax 411 to parametric modeler 419 with the use of an editor or a text file that can be read by parametric modeler 419.

Parametric Model

The parametric configuration language 410 is an object oriented interpreted language with strong typing. The fundamental modeling concept is Parameter. Its role is similar to the Class concept of Object Oriented Programming (OOP). Beyond the syntactic similarity between a Class and Parameter, there exist fundamental differences. Most OOP languages have no language support for a persistent data model and no query capability. Furthermore, OOP has no language level capability to declare and reference objects with logical names outside a Class declaration. In addition, OOP has no language level support for search, optimization, and constraint solving. Parametric modeling, search, constraint based declarative programming, and query are useful capabilities of parametric configuration 100 for building product parametric models and creating the best design for customer 120 requirements. The language level support for search, optimization, and query enables product designers 140 to create fully parameterized products without programming in low level languages, like Java or C++. With the built-in search and optimization, designers 140 and customers 120 can concentrate on defining the requirements, rather than creating a design that meets the requirements. The parametric configurator 101 can create the designs automatically from requirements expressed in parametric configuration language 410.

FIG. 7 is a possible parametric model 420 of a center bearing, shown in the syntax of an exemplary parametric configuration language 410 that has the capabilities shown in FIG. 4, such as parametric modeling, parametric data management, constraint, search, optimization, and computation. Many details of a physical center bearing are not essential to parametric optimization. For example, the exact shape of a center bearing is not described by the model 420. The assembly 705 child parameter instance 423 captures all the geometric characteristics and properties of the CenterBearing 700 parameter. The bounds 710 child is a parameter instance 423 of the Box 613 parameter. The function draw( ) 715 displays an instance of CenterBearing 700 in a 3D scene and labels it with the name displayName_720. The function find( ) 725 returns an instance of a CenterBearing 700 that is identified by name_730. The parametric data management system 418 may be searched for this object if it is not available locally. The function create( ) 735 creates a new parameter instance 423 of CenterBearing 700 from a set of primary child parameters 504 of CenterBearing 700: pinCenterOffset_, centerOffset_, verticalOffset_, and horizontalOffset_. A parameter 500 is "primary" if it is not computed from other parameters 500. The function initialize( ) 750 computes the computed parameters of an assembly. The bounds 710, which is a child parameter 504, is computed by the initialize( ) function 750 from the primary parameters 500. The height of the CenterBearing 700 is equal to the distance from the center of the CenterBearing 700 to its mounting plane to a bracket. The function arrange( ) 740 computes and sets the internal layout and orientation of a parameterized Assembly 611. The internal layout and orientation of an Assembly 611 is not always stored in parametric data management system 418. It is usually computed from a set of constraints 102 and a set of primary parameters 500. When the internal layout and orientation is specified by constraints 102, only the constraints 102 are stored in the parametric data management system 418. The CenterBearing 700 geometry that is essential to optimization of a driveline is expressed only in terms of geometry parameter types 501 depicted in FIG. 6. The display( ) function 745 will display the CenterBearing 700 object in graphical form.

Parametric Configurator

The parametric configurator 101 in the embodiment shown in FIG. 4 includes a hierarchical solver 403, search engine 401, an optimization engine 402, execution rollback 404 functionality, one or more geometric solvers 405, one or more domain specific solvers 406, visualization 407 functionality, parametric data synchronizer 408 functionality, and concurrency management 409 functionality. Each of these capabilities will be explained in more detail below.

Hierarchical Solver

When the number of product parameters 500 is large, the execution time for finding the best design may be too long for practical purposes. The number of candidate designs will grow combinatorially with the number of parameter 500 values. For example, a bus seat layout depends on the chassis, the doors, the windows, and the bus floor. A bus seat can be positioned anywhere inside the bus but it cannot block a kick-out window, and a bus seat cannot be bolted on a welding joint on the floor. It is not feasible to find a solution in a reasonable time without breaking the design into smaller subdesigns 920. Breaking the overall product design into subdesigns 920 that can be optimized independently reduces the parametric configurator 101 execution time. Parametric configuration 100 provides a hierarchical approach to designing complex products.

When a product is designed sequentially, where in each step a subdesign is optimized, the product design may fail at a later stage because an earlier subdesign choice eliminates all subsequent subdesign possibilities. For example, after seat layout of a bus is designed, it may not be possible to have the required kick-out windows because seats are always blocking at least one of the kick-out windows. The design process must roll back to the point where seats were designed and the design process must start with another possible seat layout. For example, seat spacing may be adjusted and possibly one seat may be dropped to clear the blockage of windows by seats.

A complex product has up to hundreds of subdesign 920 steps where a design search or optimization fails. It would be very difficult for a designer 140 to keep track which subdesign 920 process, and candidate solution for the next subdesign 920, to which a search should roll back. Parametric configuration 100, through its parametric configuration language 410, supports automatic rollback by the parametric configurator 101 of a tentative design to a previously executed design step. Through the search engine 401, optimization engine 402, geometric solver 405, and domain specific solvers 406, parametric configuration 100 supports a general purpose design with search, optimization, automatic rollback, and hierarchical subdesign.

Rollback

A complex product design is broken down by a designer 140 using parametric configuration language 410 into smaller designs that are searched sequentially. For example, a truck design can include two subdesigns 920: powertrain and driveline 1320. A breakdown of the overall truck design into subdesigns 920 enables a customer 120 to set priorities. For example, customer 120 may prefer a fuel efficient truck first, and a driveline 1320 with the least number of shafts 1303 second. The customer 120 specifies the minimum acceptable fuel efficiency and minimum acceptable drive shaft 1303 count. Parametric configuration language 410 can be used to require that the parametric configurator 101 search for the first acceptable powertrain first. The first acceptable design then can be used as input to driveline 1320 design search. It is possible that no acceptable driveline 1320 is found after the first acceptable power train. The customer 120 would expect that second best power train should be used. The parametric configurator 101 has a built-in a rollback mechanism to find a truck in case the latest stage of search fails. In the truck example above, it will automatically roll back the truck optimization to the power train optimization point where the last acceptable powertrain was found, and then continue searching the next acceptable power train that can potentially lead to a successful search of an acceptable driveline 1320.

Search Engine

The search engine 401 of the parametric configurator 101 provides the capability to search for a viable solution to a design, typically a solution of a subdesign 920 or a sequence of subdesigns 920. A listing of a simple search in parametric configuration language 410 is shown in the code segment of FIG. 8a. The "search" keyword 800 marks the beginning of a search that is the point of execution rollback 404 if the search fails. The "branch" keyword 810 creates a search branch 811. A tree of search branches 811 can be created by having multiple branch statements 810 as in the example shown in FIG. 8a. The exemplary code segment searches for two numbers whose product is 18. The "require" keyword 820 specifies the condition for success. When the first branch 811 sets the first number to 1 and second branch 811 sets the second number to 18, the required condition is satisfied and search is terminated. If the first-found values of 1 and 18 causes the design to fail at later design stage, execution rollback 404 will resume the search, next finding values 2 and 9 and trying the later stages of design again.

Optimization Engine

The optimization engine 402 of the parametric configurator 101 provides the capability to search for a solution to a design that satisfies some measure of "goodness." A listing of a simple optimization in parametric configuration language 410 is shown in the code segment of FIG. 8b. The syntax is identical to the search loop of FIG. 8a, except that the "require" keyword 820 is replaced by "maximize" or "minimize". The maximize keyword 830 will cause the depicted search to find two boxes whose total volume is largest. Parametric configuration will try all Box 613 combinations and rank them by their total volume. Only those combinations whose total length is less than 60 inches are searched 840. The pair whose total volume is the largest will be the best solution. If best design search fails at a later stage, execution rollback 404 will cause the design search to try a second best solution.

Example Subdesign Hierarchy

Figure 9:
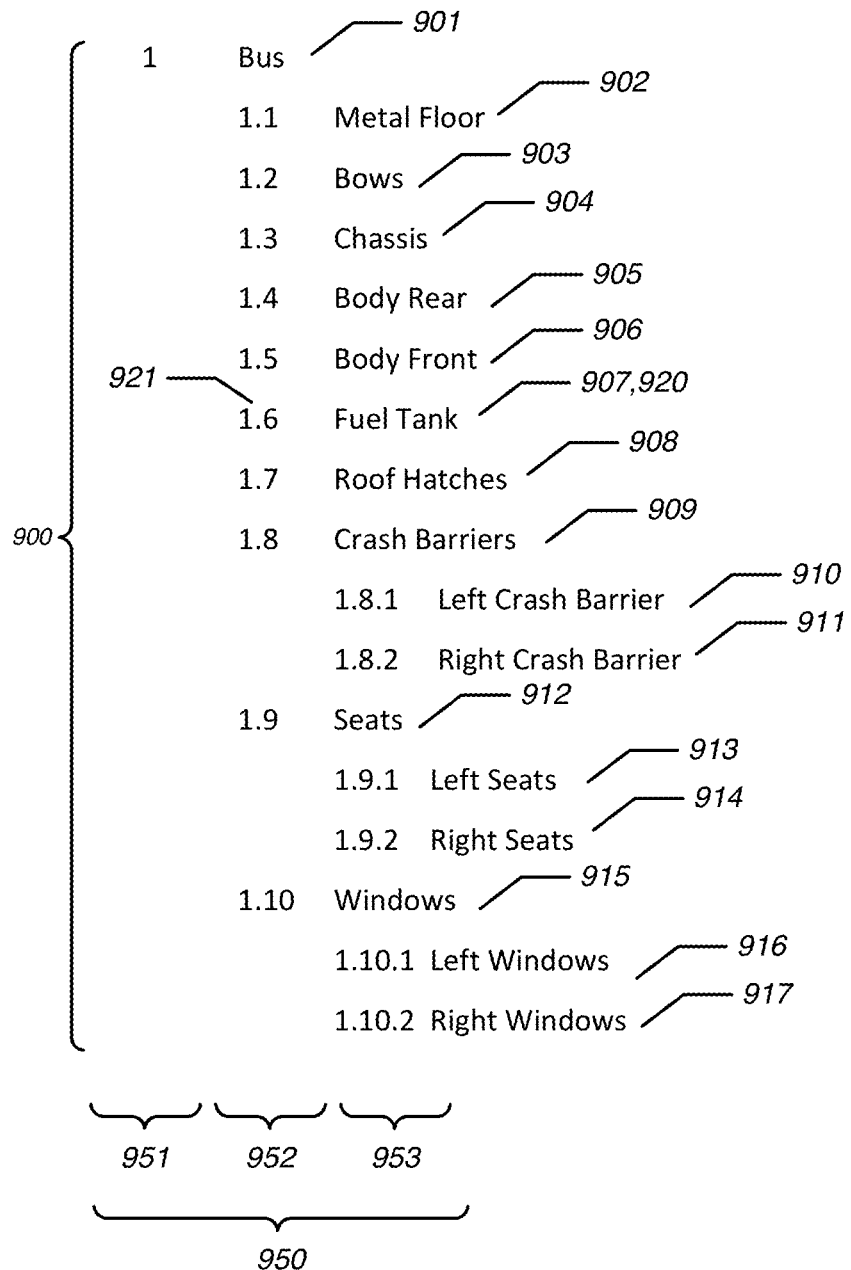
FIG. 9 illustrates a subdesign hierarchy for a portion of a bus.

FIG. 9 gives an example of a subdesign hierarchy 900 for a product that might be designed using parametric configuration 100. Each line in the subdesign hierarchy 900 shown represents a subdesign 920, typified by fuel tank 907, whose identification number 921 is 1.6. The subdesign hierarchy 900 has three levels 950. Levels in the subdesign hierarchy 900 are indicated by indentation and by the identification numbers 921. The bus 901 subdesign, at level 1 951, is the parent of all the level 2 952 child subdesigns 920, namely, floor 902, bows 903, chassis 904, rear body 905, front body 906, fuel tank 907, hatches 908, crash barriers 909, seats 912, and windows 915. The crash barriers 909 subdesign has children at level 3 953, namely, left crash barrier 910 and right crash barrier 911. Similarly, seats 912 is the parent of left seats 913 and right seats 914, and left windows 916 and right windows 917 are the children of windows 915.

Designing the subdesigns 920 in sequence is usually important, because internal constraints 107 are often generated automatically by earlier subdesigns 920 that limit subsequent ones. For example, it would not be possible to position the hatches 908 before the bows 903 are designed. In some embodiments, except for the last subdesign 920 (here, right windows 917), there is always a "next" one; and except for the first subdesign 920 (here, bus 901), there is always a previous one. The next subdesign 920 may be at the same level 950 as the current one, or it might be a child. Other embodiments might allow separate processors or threads to process independent subdesigns 920 at the same level 950 in parallel when feasible.

Hierarchical Solution Using Search

Figure 10:
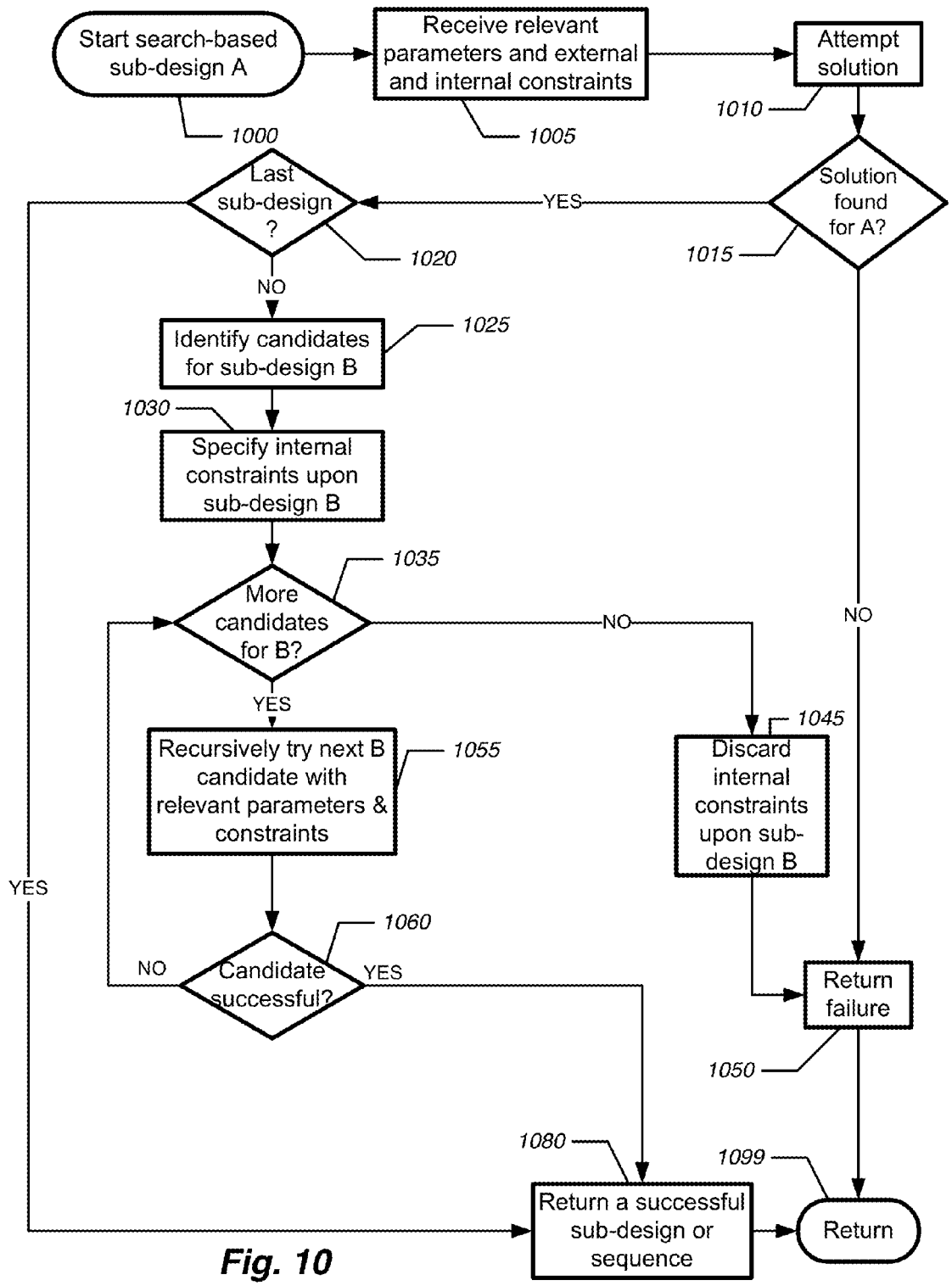
FIG. 10 is a flowchart illustrating hierarchical subdesign with the goal of search.

FIG. 10 is a flowchart illustrating the logic of an embodiment of the hierarchical solver 403, execution rollback 404, and, search engine 401 capabilities of the parametric configurator 101 for performing a design. Like the code segment of FIG. 8a, the search function of FIG. 10 does no optimization. Another code function might initiate a search by invoking this search function, which starts at step 1000, but the search function is recursive, so the invoking function might be this function itself. In FIG. 9, for example, the function of FIG. 10 might be invoked once for bus 901, which would be considered "subdesign A" in the flowchart, and the "next" subdesign 920, namely, floor 902 would be considered "subdesign B".

The function is invoked recursively at step 1055, at which point floor 902 would become 'A' and bows 903 would be the 'B' subdesign 920.

In step 1005, all external constraints 103 and internal constraints 107 applicable to the current subdesign 920 are received by the function. They might be passed to the function as arguments, or might be accessed in the parametric data management system 418. A solution to the constraints 102 for the current subdesign 920 is attempted in step 1010. Depending on the problem, geometric solvers 405 or particular domain specific solvers 406 may be brought to bear. These might be simple, such as the factoring solver of FIG. 8a, or complex, such as geometric solvers 405 and various kinds of domain specific solvers 406 that are available commercially. A domain specific solver 406 can also be written in parametric configuration language 410, or in a standard language such as Java or C. An example of such a domain specific solver 406 might optimally position hatches 908 among the bows 903 of a bus. While the details of particular solvers are not critical to the invention, the capability of the hierarchical solver 403 to exploit and sensibly integrate them all is an important concept. A check is made in step 1015 to see whether a solution was found. If not, in step 1050 a failure status is set, and the function returns to the calling function in step 1099.

If a solution is found at the current level 950, then in step 1020 a determination is made if this is the last subdesign 920 in the overall design. For example, in FIG. 9, there are no subdesigns 920 after right windows 917, so no recursion will be performed from that subdesign 920. In this case, step 1080 causes the current subdesign 920 to be successfully returned in step 1099. On the other hand, if there is a next subdesign 920, then in step 1025, the hierarchical solver 403 identifies candidates for that subdesign 920. The candidates might be chosen from a finite number of choices. When the choice is a range, that range might be discretized by subdivision, with candidates chosen, for example, at equally spaced intervals or according to some randomization scheme. Some solvers can handle continuous functions, possibly performing their own discretization internally. The hierarchical solver 403 can execute those functions and integrate them into the subdesign 920 process.

In step 1030, all constraints 102 applicable to the next level are specified. These include any external constraints 103 from customers 120, designers 140, or manufacturers 130, or internal constraints 107 generated at the current or any previous level 950 of subdesign 920.

A loop through the candidate B subdesigns 920 begins at step 1035, where a check is made to see whether there are any remaining candidates to check for viability. If not, we begin the process of execution rollback 404 in step 1045 discarding now superfluous internal constraints that were applied to subdesign 920 B, and in step 1050 set the status of the current subdesign 920 to failure, and return in step 1099. Note that rollback 404 might cause regression to a rollback point through two or more levels 950 in the hierarchy 900, for example, if we have exhausted the last candidate subdesign for a grandchild of the last subdesign for a child of the parent.

If there is at least one remaining candidate for subdesign 920 B, in step 1055 we try the next untested candidate. As mentioned previously, in the embodiment shown this is a recursive call to the function of FIG. 10 itself. If, in step 1060, the candidate returns successfully, then the whole function returns success through step 1080. Notice that the first successful candidate is returned because the pure search function seeks any viable solution. Otherwise, flow returns to step 1035 to check for more candidates.

The hierarchical search of subdesigns 920 together with the rollback 404 capability makes complex products to be optimized in a period acceptable to the customer 120. Breakdown of the complex designs into subdesigns 920 also reduces the complexity of parametric models 420. Common product configurator 135 and standard programming languages have no direct support for hierarchical searches and rollback. Parametric configuration language 410 provides direct support for hierarchical subdesign and searches.

Hierarchical Solution Using Optimization

Figure 11:
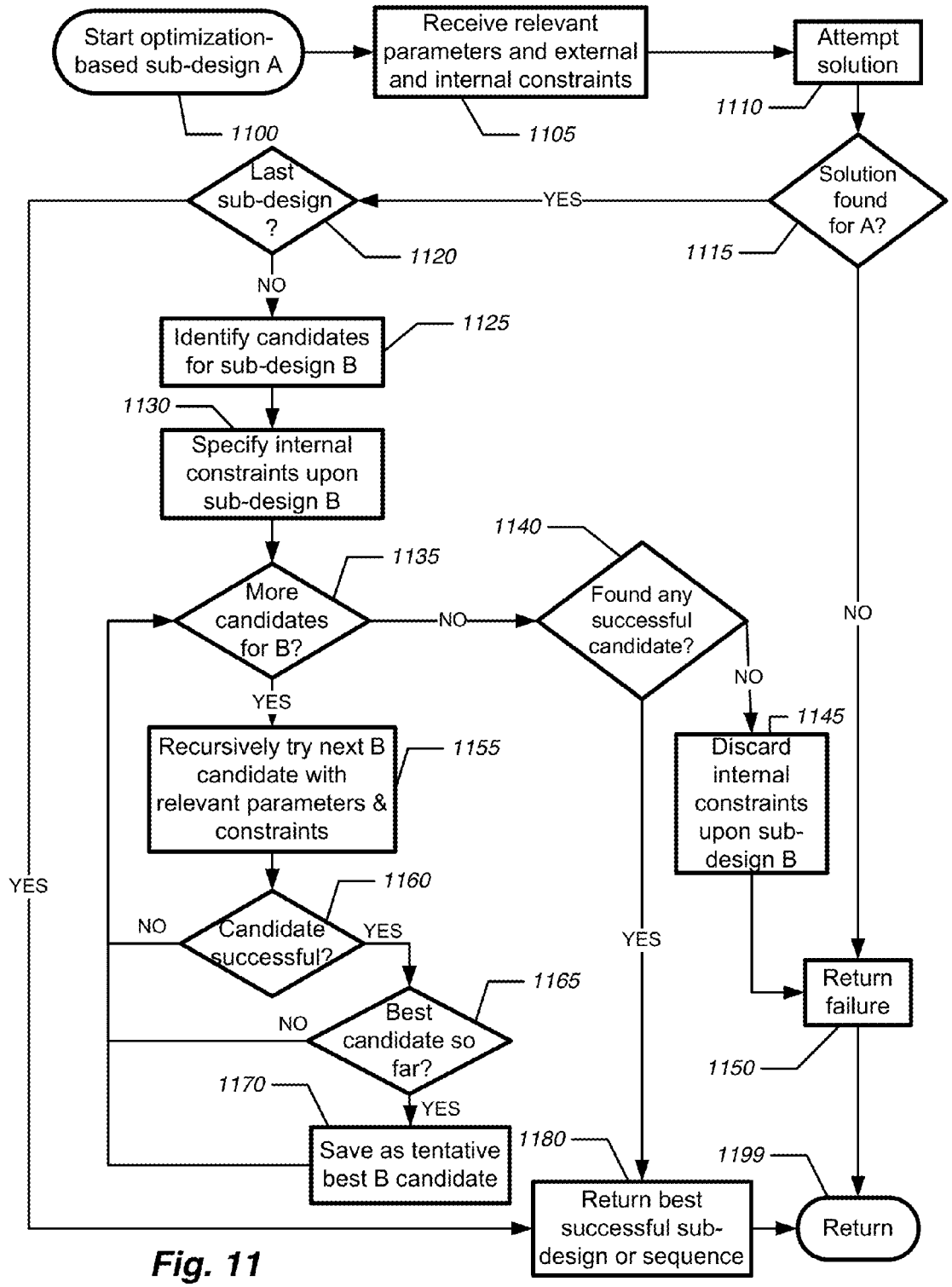
FIG. 11 is a flowchart illustrating hierarchical subdesign with the goal of optimization.

Like FIG. 10, FIG. 11 is a flowchart illustrating the logic of an embodiment of the hierarchical solver 403, and execution rollback 404 capabilities of the parametric configurator 101 for performing a design. In contrast to FIG. 10, which searches for any viable subdesign 920, the process of FIG. 11 finds a best solution according to criteria specified by a user 141.

Most of the steps in FIG. 11 are identical to those of FIG. 10, and the figures have been numbered to emphasize that fact. Thus, for example, "Attempt solution" is step 1010 in FIG. 10, and step 1110 in FIG. 11. For the convenience of the reader, the description of FIG. 11 will, therefore, be restricted to the distinct portions. These differences all pertain to the loop through candidate subdesigns 920, starting at step 1135. If a successful candidate is found in step 1160, that candidate is compared to any previous candidates in step 1165. The best subdesign 920 B candidate so far, according to some goodness measure, is retained in step 1170. If in step 1135 no more candidates remain, then a check is made in step 1140 to see whether any candidates were successful. If so, then the best successful one is returned to the calling function in step 1180. Otherwise, we proceed to step 1145 to discard no longer needed internal constraints 107. Selecting local optimization for selected subdesigns 920, rather than global optimization for a whole design, can be critical to making a complex problem tractable.

FIG. 10 and FIG. 11 depict pure search and pure optimization subdesign, respectively. A reader skilled in the art will realize that mixed embodiments are also possible, where some subdesign 920 are optimized; while in others any solution that satisfies the constraints is adequate. Such a reader will also recognize that the other orders of the steps in those figures are possible without departing from the concepts of the invention, and that some steps may be omitted and or others added. Language level support in parametric configuration language 410 for search and optimization eliminates the burden of creating complex search and rollback 404 by designers 140.

Example Hierarchical Solution

Figure 12A:
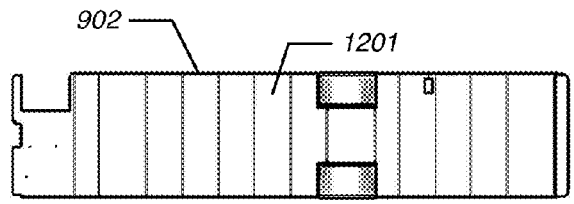
FIG. 12a is a top view of a floor subdesign in an exemplary hierarchy of subdesigns for a bus.
Figure 12B:
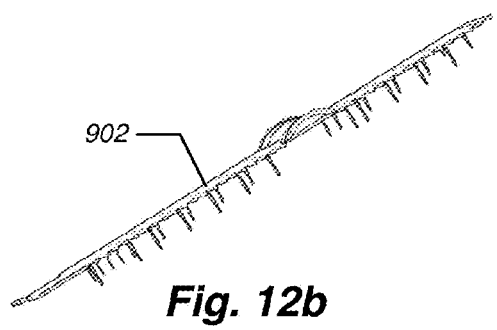
FIG. 12b is an isometric view of a floor subdesign in an exemplary hierarchy of subdesigns for a bus.
Figure 12C:
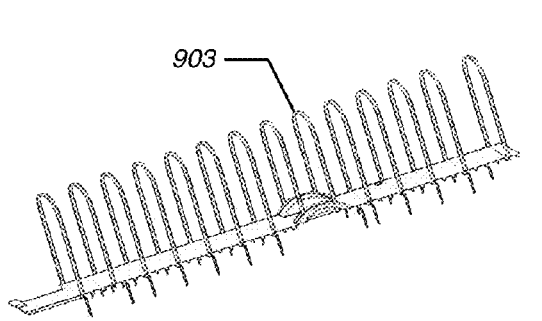
FIG. 12c is an isometric view in an exemplary hierarchy of subdesigns for a bus, adding a subdesign for bows to the previous subdesign.

The application of the hierarchical solver 403 to design of a portion of a bus according to the subdesign hierarchy 900 of FIG. 9 is illustrated in FIGS. 12a through 12k. The sequence of the figures corresponds to the sequence in which the subdesigns 920 are solved using an optimization engine 402 such as that shown in FIG. 11. All the figures were produced using parametric configuration language 410, the visualization 407 capability of the parametric configurator 101, and a graphical user interface 300. For clarity, reference numbers will only be displayed for those features that change from one figure to the next. FIG. 12a is a top view of the floor 902, showing division of the floor 902, which is subdivided into plates 1201 that are welded together. The locations of the welds between the plates 1201 are an example of how a given subdesign 920 can result in the generation of internal constraints 107 upon subsequent subdesigns 920 in the hierarchy 900. Because seats 912 cannot be bolted to the floor 902 on a weld, the positions of the seats 912 will be constrained by the positions of the plates 1201. The positions of the seats 912, in turn, will impose internal constraints 107 on the positions of the windows 915. FIG. 12b is an isometric view of the floor 902 that corresponds to FIG. 12a. The bows 903 of the bus 901 are added in the next subdesign 920, shown in FIG. 12c.

Figure 12D:
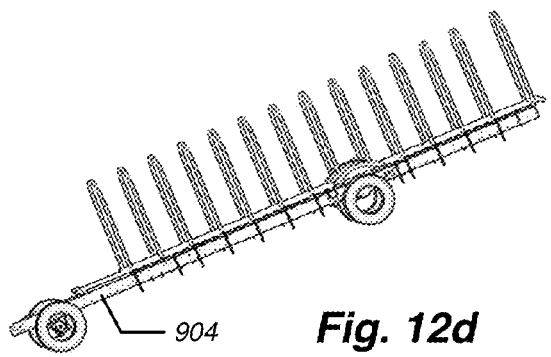
FIG. 12d is an isometric view in an exemplary hierarchy of subdesigns for a bus, adding a chassis subdesign to the previous subdesign.
Figure 12E:
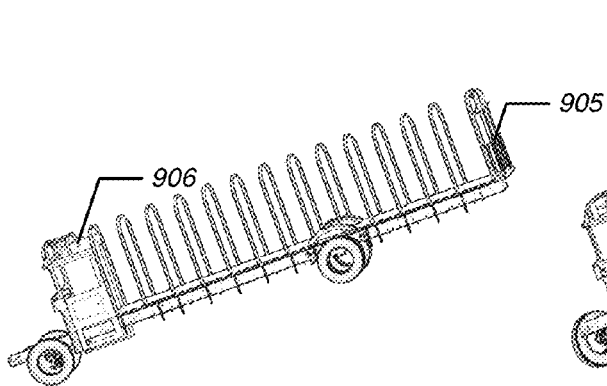
FIG. 12e is an isometric view in an exemplary hierarchy of subdesigns for a bus, adding front and rear cowl subdesigns to the previous subdesign.
Figure 12F:
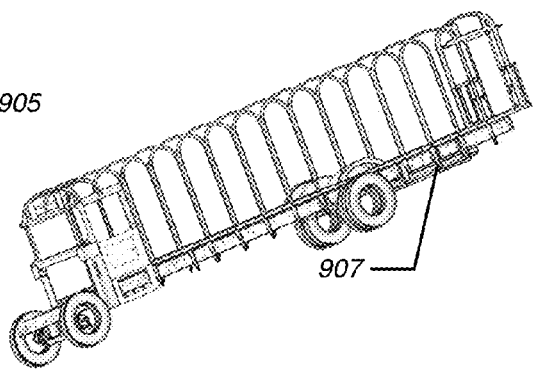
FIG. 12f is an isometric view in an exemplary hierarchy of subdesigns for a bus, adding a fuel tank subdesign to the previous subdesign.

The chassis 904 of FIG. 12d is the next subdesign 920. The rear body 905 and front body 906, or "cowls," are integrated into the design in FIG. 12e. A fuel tank 907 is added in FIG. 12f, and hatches 908, in FIG. 12g and FIG. 12h. The rear body 905, front body 906, fuel tank 907, and hatches 908 can be added to the overall design in any order, so the addition of these may be an opportunity for parallel processing by the hierarchical solver 403 in some embodiments, although, of course, they might be added sequentially in other embodiments.

Figure 12G:
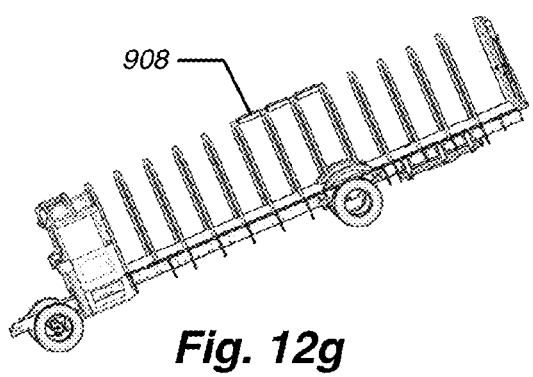
FIG. 12g is an isometric view in an exemplary hierarchy of subdesigns for a bus, adding a non-optimized subdesign for roof hatches to the previous subdesign.
Figure 12H:
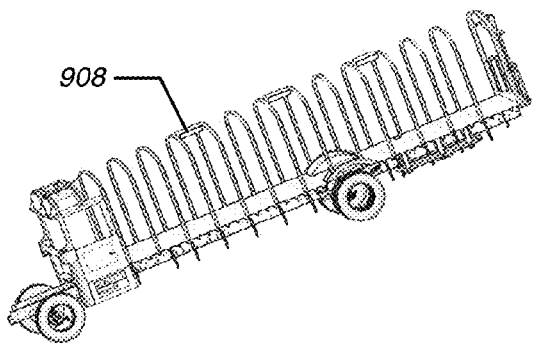
FIG. 12h is an isometric view in an exemplary hierarchy of subdesigns for a bus, after optimization of the geometry of the roof hatches of the previous subdesign.

FIG. 12g is an example of a candidate subdesign 920 that gets rejected by the hierarchical solver 403 because of safety constraints 102. The hatches 908 are repositioned in FIG. 12h to optimize emergency escape routes for all bus passengers.

Figure 12I:
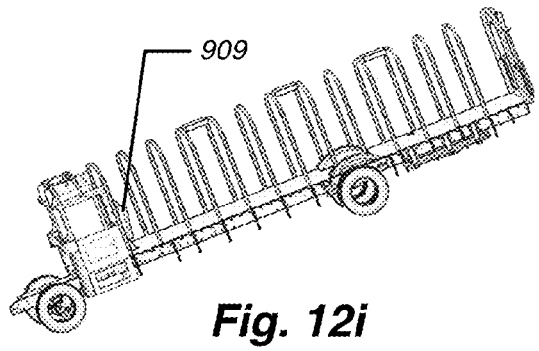
FIG. 12i is an isometric view in an exemplary hierarchy of subdesigns for a bus, adding a crash barrier subdesign to the previous subdesign.
Figure 12J:
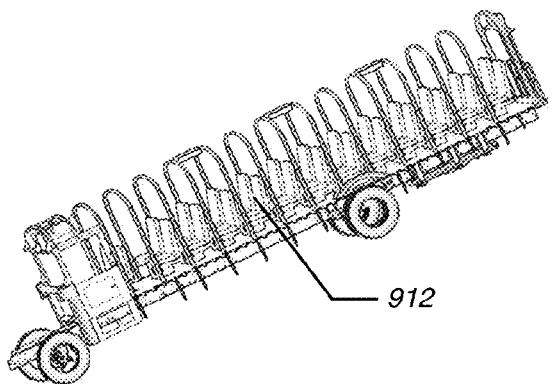
FIG. 12j is an isometric view in an exemplary hierarchy of subdesigns for a bus, adding a subdesign for seats to the previous subdesign.
Figure 12K:
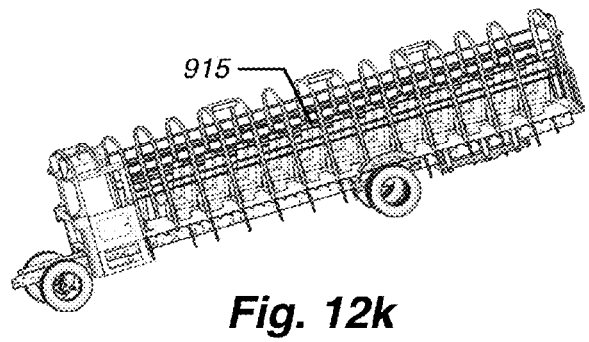
FIG. 12k is an isometric view in an exemplary hierarchy of subdesigns for a bus, adding a subdesign for windows to the previous subdesign.

The remainder of the subdesign hierarchy 900 is completed with the left and right crash barriers 909 in FIG. 12i, seats 912 in FIG. 12j, and windows 915 in FIG. 12k.

Goodness Measure

Selecting the best parametric design 111 with a parametric configurator 101 occurs within an iterative process which calculates the most appropriate components that make up a product. In the example of building a vehicle, the selection of the "best" driveline component from a set of possible driveline designs depends on a measure of goodness of the driveline characteristics.

Some embodiment of the present invention utilizes an average measure of goodness to rank the acceptable designs that satisfy requirements and specifications. Optimization first identifies a set of acceptable product designs. Then, each product design is assigned a grade, and ranked by grade. Finally, the product design that has the best grade is selected.

In one embodiment of the parametric configurator 101, a goodness measure is used to determine the most appropriate selection of a product design or components within a product design. A generic measure of goodness can be constructed in a number of ways. For example, the goodness of each subdesign 920 might be defined to range from 0 to 100. The goodness of the overall design might be a weighted average of the respective goodnesses of the subdesigns 920.

A measure of goodness can be used to filter solutions found by search, as well as rank the solutions. In an optimization loop such as that shown in FIG. 11, parametric configuration 100 finds the design that has the best goodness. In contrast, a search loop, as in FIG. 10, may require a design that satisfies a minimum goodness requirement. The minimum criterion for search success criteria is the satisfaction of all constraints 102. When multiple designs exist, a goodness measure is necessary to compare them, and select one design.

Solvers

Parametric configuration 100 creates a product that complies with all requirements that are expressed as constraints 102. All customer 120 requirements, engineering requirements, and regulatory requirements are expressed as constraints 102, which are solved by search or optimization, in combination with geometric solvers 405 or domain specific solvers 406. Some embodiments of parametric configuration 100 provide a default geometric solver 405 for geometric constraints 102, and generic capability to design a product by searching a design that meets all constraints 102. When the generic search/optimization loops of FIG. 10 or FIG. 11 would be inefficient, the parametric configurator 101 can delegate the search and constraint 102 solving to domain specific solvers 406.

Solvers for many types of problems are documented in the literature, or are available commercially. An important advantage of the hierarchical solver 403 is the ability to exploit and integrate such solvers into an overall design solution. For example, a driveline optimizer might be implemented outside the parametric configuration language 410, and then driveline optimization could be delegated to the driveline optimizer. Parametric configuration 100 provides access to the driveline optimizer through the parametric configuration language 410.

Figure 13A:
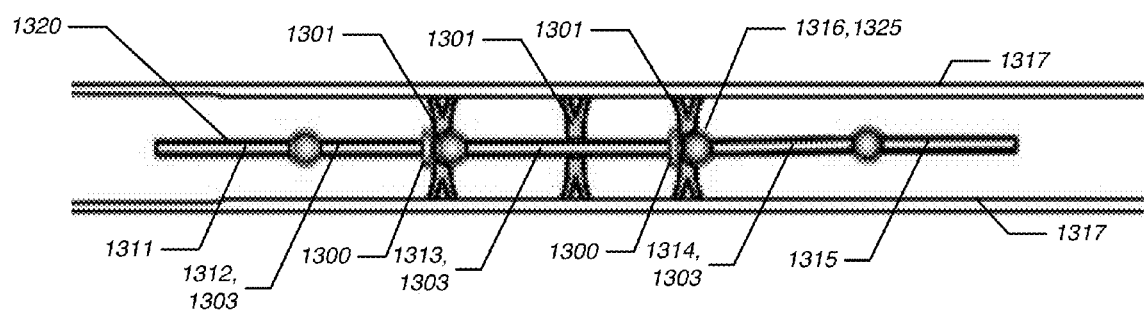
FIG. 13a is an isometric view of a driveline center bearing bracket and the components to which it connects.

Our goal here is to present how parametric configuration language 410 can be used to invoke a default geometric solver 405 in some embodiments, but first we provide some context to make the example understandable. FIG. 13*a* shows an instance of a solution found by a parametric configurator 101, in an embodiment of the invention, for the driveline 1320 of a truck. This driveline 1320, which is viewed from below, includes a transmission shaft 1311, a rear axle shaft 1315, and three drive shafts 1303, namely, drive shaft one 1312, drive shaft two 1313, and drive shaft three 1314. The shafts of the driveline 1320 are coupled to each other at joints 1316, such as the typical joint 1316 labeled in the figure. (The spherical joint is a simplification of real joint geometry, which suffices for purpose of the parametric model 420 in the embodiment shown.) Two parallel rails 1317, are part of the frame, or skeleton, of the truck. Three cross members 1301 are perpendicular to the two rails 1317, and connect to them. Shaft mounts 1300 suspend the driveline 1320 from two of the cross members 1301, below the frame.

Figure 13B:
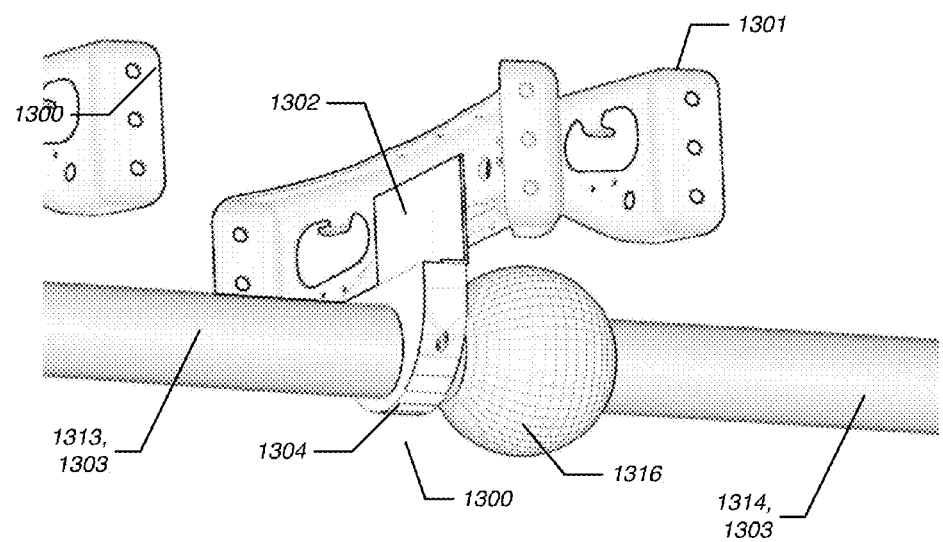
FIG. 13b is an isometric view of a driveline assembly designed by parametric configuration in an embodiment of the invention.

FIG. 13*b* is an isometric view, also produced by parametric configuration 100 and capable of being displayed to users 141 through the parametric configuration user interface 320 or the parametric data management system user interface 429, that shows details of the attachment of the drive shaft 1303 to a cross member 1301. The shaft mount 1300 includes a center bearing 1304, which holds the drive shaft 1303 and allows it to rotate around its axis, and a center bearing bracket 1302, which attaches the center bearing bracket 1302 to the cross member 1301. The drive shaft 1303 makes an angle with the horizontal plane of the rails 1317 which must be maintained by the center bearing bracket 1302. The geometry of the center bearing bracket 1302 is the focus of our next discussion.

Figure 14:
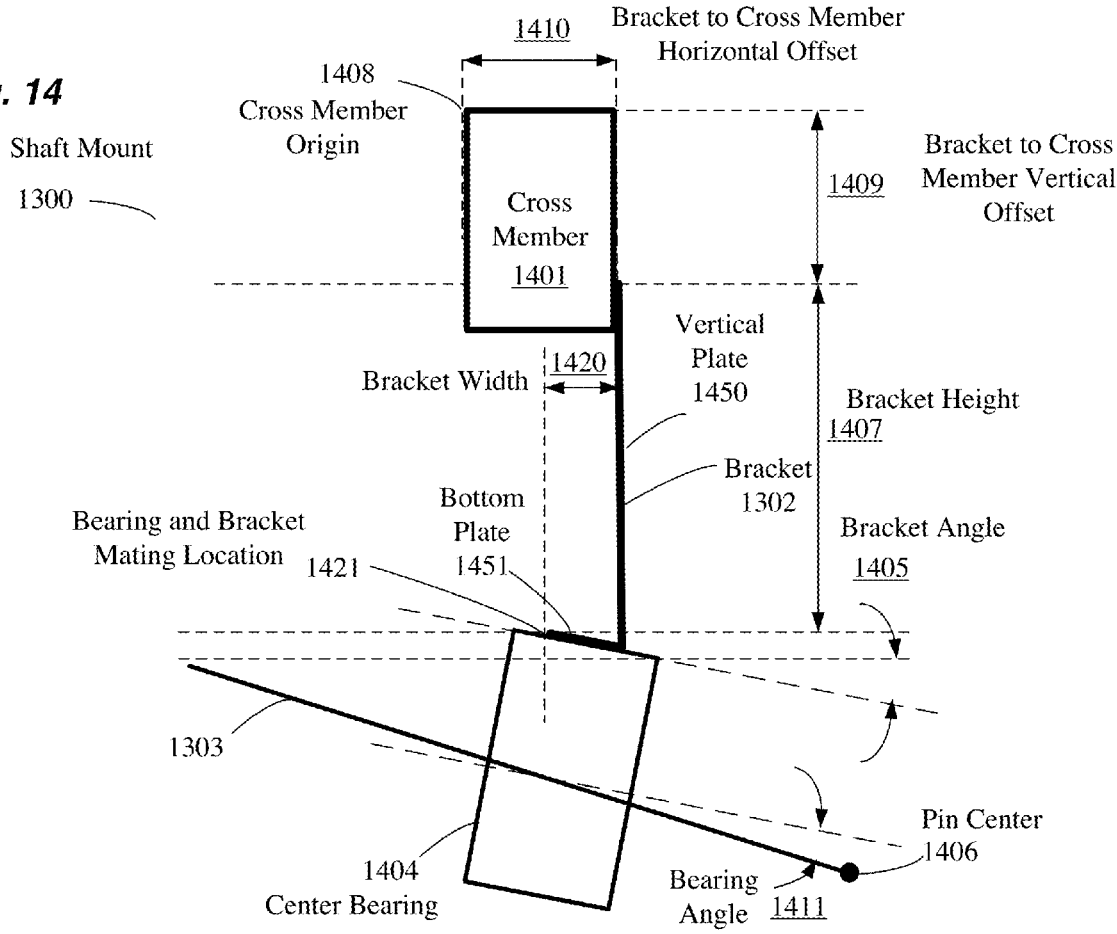
FIG. 14 is a two dimensional parametric model of the geometry of a driveline center bearing bracket and the components to which it connects.

The center bearing bracket 1302 illustrates the capabilities of the parametric configuration 100. A bracket 1302 can come in many shapes. A common shape is an L-shape that can be constructed from a vertical and horizontal line. Parametric configuration 100 represents a bracket 1302 as two planes that are coincident at a line and that have an angle constraint 102 between them. All locations in the figure are referenced to a single point, the cross member origin 1408. Each plate has a mating point, such as the bearing and bracket mating location 1421. The vertical plate 1450 mates with a cross member 1301, and the bottom plate 1451 mates with a center bearing 1304. The overall geometric relationship among a cross member 1301, a center bearing bracket 1302, and a center bearing 1304 of a drive shaft 1303 is illustrated in FIG. 14. The shaft mount 1300, such as the one depicted by the figure, is a critical assembly for driveline 1320 optimization and chassis 904 layout. As shown in FIG. 13*a*, the driveline 1320 utilizes a collection of shaft mount 1300 instances that provides the best driveline 1320 for customer 120 requirements. The design optimization includes finding the optimal number of shaft mount 1300 instances, their parameter values, and finding matching parts. The shaft mount 1300 instances are created by solving the shaft mount 1300 constraints. The shaft mount assembly is then checked for goodness by the driveline 1320 optimizer. The shaft mount 1300 comprises a cross member 1301, a bracket 1302, and a drive shaft 1303 with a center bearing 1304. The geometric solver 405 finds the location of the pin center 1306 for a given cross member 1301 (the point where one shaft 1303 couples with the next, within a joint 1316), bracket height 1407, vertical offset 1409, bracket width 1420, horizontal offset 1410, bracket angle 1305, and bearing angle 1411.

The bracket 1302 has three primary parameters, bracket height 1407, bracket width 1420, and bracket angle 1305. The actual height and width of a physical bracket are different than the parametric bracket height 1407 and bracket width 1420. The parametric bracket height 1407 and bracket width 1420 are the offsets from a reference point (namely, the bearing and bracket mating location 1421) to cross member 1301 and center bearing 1304 mating points. The parameterization abstracts the bracket 1302 geometric primitives that are relevant to finding its optimal realization in a driveline 1320. By eliminating unnecessary details, an optimizer can solve many types of brackets 1302 that come in different shapes and materials. They all share the same parametric model 420. In contrast, in a traditional manufacturing system they may have different part numbers and bill of materials.

An embodiment of a driveline optimizer takes a collection of shaft mount 1300 instances and a collection of candidate shaft mount locations for each shaft mount 1300 as input. The driveline optimizer tries a collection of bracket heights 1407, a collection of bracket widths 1420, and set of bracket angles 1305 to create a collection of candidate brackets 1302. Similarly a collection of shaft mounts 1300 is created by solving the geometry to obtain the candidate pin centers 1306. The driveline 1320 optimizer creates a collection of candidate drivelines 1320 from the collection of pin centers 1306. The collection of candidate drivelines 1320 is optimized with an optimization loop to select the best driveline 1320. The driveline 1320 optimizer returns the drive shafts 1303; their pin center 1306 coordinates as the specification of the best solution.

The overall optimization of the driveline might in some embodiments be limited to existing brackets 1302 and cross member 1301 locations. When a general optimization is desired, optimization can be carried out using a generated list of brackets 1302. For example, a bracket 1302 can be generated for each possible value of bracket angle 1305 with 0.05 degree angle increments. Similarly a bracket height 1407 and a bracket width 1420 can be generated by 0.05 inch increments. Alternatively, the collection of parameterized brackets 1302 can be limited to generate a collection of existing physical brackets. When a general optimization is obtained first, the physical brackets are selected by matching of parametric bracket height 1407, bracket width 1420, and bracket angle 1305 to a height, width, and angle of an existing physical bracket. Usually an exact match is not possible. In that case, the optimizer selects the closest parametric brackets and carries out another optimization to determine the best physical brackets.

The listing in FIG. 15 of a parametric configuration language 410 code fragment demonstrates a generic geometric solver 405 applied to design of a center bearing bracket 1302. The function arrange( ) 1500 designs a CenterBearingBracket 1510 object, a parametric model 420 of a center bearing bracket 1302. A geometric solver 405 forms the CenterBearingBracket 1510 from two Box 613 objects, a vertical plate 1520 and a bottom plate 1525 (or horizontal plate).

Function arrange( ) 1500 first creates 1530 solver, an instance of a GeometricSolver. Then, the location and orientation of vertical plate are fixed 1535. Four constraints 102 are specified 1540 to the geometric solver 405 to locate and orient the bottom plate. Finally a call is made 1550 to solver to compute the location and orientation of the bottom plate.

To illustrate the specification of constraints 102 defining subassemblies, FIGS. 16*a* and 16*b* show a complete parametric model 420, in parametric configuration language 410, for the design of a center bearing bracket 1302. FIG. 17 is a complete parametric model 420, in parametric configuration language 410, for the design of a center bearing 1304.

Driveline Example

Some embodiments include functionality to model a product using a parametric configurator 101 without feature codes and part numbers. With use of a parametric configurator 101, a complex product can be assembled from a set of discrete parts by matching their physical and geometric characteristics.

One component in particular, the driveline 1320, is a critical determinant of dynamical characteristics of a ground vehicle. A poorly designed driveline 1320 can cause vibration noise, excessive wear, and severe damage under unexpected articulation. Driveline 1320 optimization is essential to the vehicle quality, vehicle residual value, and profitability.

Despite the obvious benefits, even with existing state-of-the-art product configurators 135, truck drivelines 1320 are not optimized to an individual truck. Instead, an acceptable pre-engineered driveline 1320 is selected when it is workable. Drivelines 1320 are an excellent example of a class of parametric configuration 100 where the location and orientation of components are continuous real variables, which are critical for performance and customer 120 acceptance.

The quasi-continuous range of possible locations and orientations of driveline 1320 components makes it impossible to document the best driveline 1320 geometries for all possible truck configurations. Furthermore, the interaction of the driveline 1320 with the engine, transmission, rear axle, and other chassis 904 components like air tanks must be taken into account when configuring a driveline 1320. Rules engines are inadequate at dealing with this class of problems because configuring a driveline 1320 necessarily requires search and optimization based on physics and geometry of driveline 1320, power train, and chassis 904.

Those skilled in the art will recognize that numerous other types of complex products and product components can be designed and optimized through applications of a parametric configurator 101 and other aspects of the present invention. Those skilled in the art will also recognize that the numerous other types of vehicles and vehicle components may be designed in accordance with the following example.

The following example describes the essential engineering, model, and geometric background, for a model 420 of driveline 1320 design. The model 420 defines the data structures to store the component data and the syntax of the constraints. This disclosure adapts the terminology, conventions, and definitions of Mazziotti, J. Philip, "Dynamic Characteristics of Truck Driveline Systems," Paper No. 650189, SAE International, Warrendale, Pa. (1965).

The automated driveline 1320 selection process facilitated by use of some embodiments of the invention can design and optimize a driveline 1320 to the exact desired configuration of a truck. Such an automated process result in increased customer satisfaction by identifying and correcting driveline errors without engineering delays, and by delivering the best driveline 1320 for the customer 120 needs and preferences. Furthermore, with such a driveline 1320 optimizer, customers 120 can reduce the material cost by minimizing the number of shafts 1303; increase fuels efficiency by reducing the weight of the truck; and cut the cost of a truck by eliminating the pre-engineering of drivelines 1320.

The chassis 904 geometry is the primary input to a hierarchical solver 403 of a parametric configurator 101, which applies an optimization engine 402 to a driveline 1320, which together in this context form a driveline optimizer. The driveline optimizer links the transmission shaft 1311 to the rear axle shaft 1315 center through one or more drive shafts 1303 that are attached to the frame through cross members 1301 and center bearing brackets 1302. The number of such drive shafts 1303 and their geometries, including their lengths, their bracket angles 1305, and the centerlines, depend on the availability of locations where the center bearing 1304 can be mounted to the chassis 904 through cross members 1301. In addition, the geometry of transfer cases, auxiliary devices, and rear axle pinions further constrain the geometry of the shafts 1303.

The computation of the input chassis 904 geometry, including the locations of the chassis 904 and the driveline 1320 components, can be achieved by a procedural or a declarative method. In a procedural approach, the input data can be supplied explicitly for each vehicle, or the geometry can be partially calculated for each vehicle. The procedural approach results in tedious data maintenance and an inflexible optimizer. The amount of data grows combinatorially with the number of chassis 904 components. A parametric configurator 101, on the other hand, employs a declarative method in which chassis 904 and driveline 1320 are represented as a set of rigid bodies. The overall chassis 904 and driveline 1320 assembly is specified by a set of constraints 102.

The declarative approach requires the geometry of each rigid body and a few constraints 102 for each pair of interacting rigid bodies. In the constraint 102 based declarative approach, the geometry of each component and the constraints 102 for each interacting pair of rigid bodies are the inputs to a geometric solver 405 of a parametric configurator 101. In a constraint 102 based declarative method, data grows linearly with the number of rigid bodies and the number of interacting pairs.

Adding a new part typically requires adding only the geometric and physical characteristics of the new part, but no new constraints. The parametric configuration captures the constraints as geometric and physical relationships that must be satisfied independently of the feature or part; for example, "the engine mates with the transmission and the torque input to a driveline must be below the torque capacity of the prop shafts." When expressed as such, they have no reference to features or parts. By comparison, in a rule based configurator, features may show up in the conditions and actions of each existing or new rules, and adding a new feature requires updating many rules.

The parametric configurator 101 also eliminates features to bill of materials 134 generation rules. The parametric configurator 101 can identify the required parts by matching their physical and geometric characteristics to the computed design characteristics, and adding a new part does not add any rule or constraint 102. For example, a drive shaft 1303 part can be identified by matching length, torque, and rotational speed of the drive shaft 1303.

As previously discussed, the parametric configuration 100 driveline optimizer computes the best driveline 1320 and chassis 904 layouts during the sales phase, while a quote is prepared, and before the manufacturer commits to building the vehicle. The output is a list of features for customer quote and assurance that product can be manufactured when submitted as an order.

When processing the order for manufacturing, the same parametric configuration 100 can dynamically generate the bill of materials 134 of the driveline 1320 assembly, thus eliminating engineering costs and delays. Most importantly, the customer 120 gets the best driveline 1320 possible and an optimal chassis 904 layout without extra cost or delays. The suppliers receive a full description of the parts and their geometric data. For example, parametric configuration 100 may compute the location of holes to be drilled on the frame rails 1317 and export the data to a supplier of frame rails 1317 without creating a part number. When part numbers already exist, parametric configurator 101 selects the required parts by matching the computed part characteristics to physically existing part characteristics, without any rules. The overall driveline 1320 assembly is never pre-engineered. A best design that matches the customer 120 requirements is created and documented on demand.

For example, driveline optimization with the driveline optimizer, may include the following steps, specified in parametric configuration language 410 and utilizing the parametric data management system 418 for search and storage 2130:

- enforce the physical constraints: torque rating, critical speed, and inertial and torsional excitations;
- enforce geometric constraints on the driveline 1320, such as: locations of cross members 1301, locations of transmission and rear axle pin centers 1306, axle pinion angles, bracket angles 1305, center bearing bracket 1302 angular tolerances, and rear axle pinion rotation center, and lift axle clearances;
- optimize number of shafts 1303, shaft orientations and shaft lengths, rear axle pinion angle, and locations of cross members 1301 that support center bearings 1304;
- advise the customer 120 when the chassis 904 needs modification.
- upon finding the best driveline 1320 design, create the following design outputs (a) specification and part numbers of cross members 1301 that support computed center bearings 1304 via computed center bearing brackets 1302; (b) specification and part numbers of center bearing mounting bracket that matches to the center bearing bracket 1302; (c) specification and part numbers of drive shafts 1303 that match the computed drive shaft 1303 geometry and ratings; (d) specification and part numbers of yokes 1325 that match the computed drive shaft 1303 geometry and ratings; (e) specification and part numbers of the suspensions, which have computed pinion angle articulation; (f) driveline 1320 performance and goodness report, as illustrated by FIG. 18; (g) driveline 1320 detailed specification, as illustrated by FIGS. 19, 20a, and 20b; (h) driveline 1320 3D drawing, as illustrated by FIG. 13a; and (i) additional driveline component specifications, such as transfer case, auxiliary transmissions, jackshafts, and power take-offs.

The process disclosed above may be executed interactively through one or more graphical user interfaces 300, such as the parametric configuration user interface 320, the parametric data management system user interface 429, or the order configuration user interface 310, for free-form driveline 1320 optimization. FIG. 13a depicts a 3D image of a driveline 1320 optimized by the driveline optimizer. The optimal driveline 1320 found for this instance of a truck or a bus has three shafts 1303 and two cross members 1301 to which the shaft 1303 is attached. A bracket 1302 is computed for each shaft joint 1316.

The driveline 1320 report of FIG. 18 summarizes the optimization. A measure of goodness is specified by the driveline 1320 grade. Each feasible driveline 1320 is assigned a grade and ranked. Parametric configuration language 410 can be used to specify that the driveline 1320 grade is an average of five grades: Residual Angle Grade (97.4); Residual Torsional Acceleration Grade (78.4); Residual Drive Acceleration Grade (97.6); Residual Coast Acceleration Grade (68.8); and Residual Inertia Acceleration Grade (42.3). Parametric configuration language 410 can also specify whether the average will be weighted, and, if so, the magnitudes of the weights, and a minimum passing grade. The driveline 1320 optimizer returns the best driveline 1320 that has a passing grade for each of the five grades. When multiple driveline 1320 designs are found, the driveline 1320 that has the best overall grade is selected.

FIGS. 20a and 20b display the driveline 1320 specification for manufacturing and assembling the driveline. FIG. 19 shows the physical characteristic of each joint 1316, which are the primary determinant of driveline 1320 goodness. FIG. 19 also displays the rear axle output shaft and transmission input shaft characteristics of the best driveline 1320.

Other Parametric Configurator Functionality

The visualization 407 capability of the parametric configurator 101 allows a user 141 to display subdesigns 920 and complete designs through a user interface 300. The concurrency management 409 capability allows multiple users 141 to work on the same subdesigns 920 at the same time. The parametric data synchronizer 408 ensures that models in the parametric configurator 101 and the parametric data management system 418 are kept synchronized.

Machine Implementation

Figure 21:
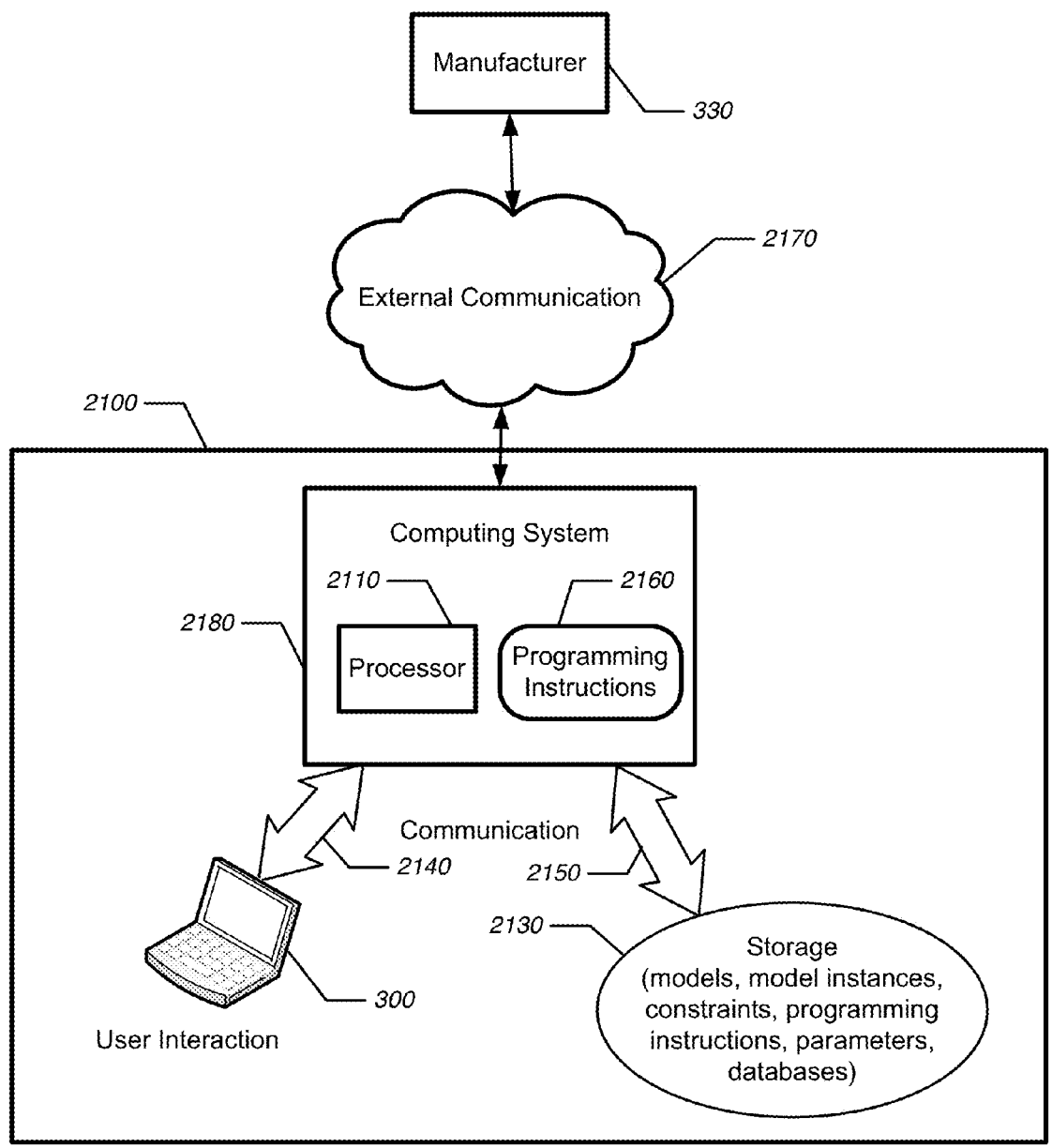
FIG. 21 is a schematic diagram of machinery on which an exemplary embodiment of the invention might be implemented.
Figure 22:
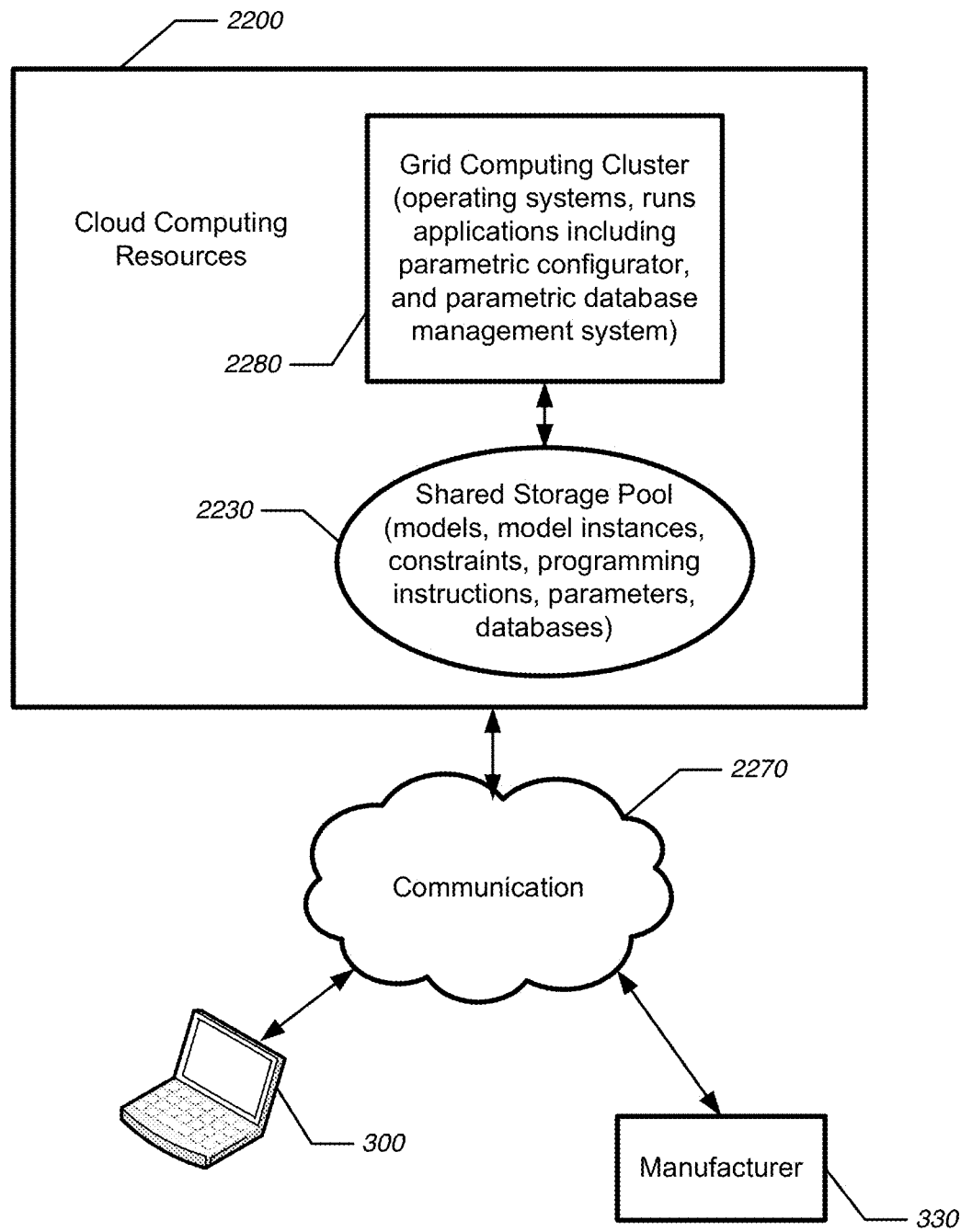
FIG. 22 is a schematic diagram of implementation of an exemplary embodiment of the invention that uses cloud computing resources.

FIG. 21 illustrates a simplified embodiment of a system 2100 upon which a parametric configuration 100 process or system might be implemented. The system 2100 includes a computer system 2180 that includes a processor 2110. The processor 2110 executes programming instructions 2160, including ones specified in parametric configuration language 410, causing the computer system 2180 to perform as a machine parametric configurator 101 and/or parametric data management system 418, with all the functionality therein, such as illustrated by embodiments summarized by FIG. 4. Interaction with users 141 might be conducted through one or more user interfaces 300, providing the functionality of a parametric configuration user interface 320, a parametric data management system user interface 429, and/or an order configuration user interface 310. Of particular interest is specification of constraints 102 for parametric models 420 and parametric instances 423 for products. Tangible storage 2130 is provided to store information such as parametric models 420, parametric instances 423, constraints 102, parameters 500 and their values, programming instructions 2160, and databases such as the parametric data management system 418. The computer system 2180 exchanges information with user interfaces 300 and storage 2130 via communications pathways 2140 and 2150, respectively. The computer system 2180 might also communication with external sources, as illustrated by pathway external communication 2170. These communication pathways might be implemented with any technology, or combination of technologies, wired or wireless, such as a network (wide area, local area, or personal are), a bus, or a serial or parallel connection. FIG. 22 shows a special case of FIG. 21, employing cloud computing resources 2200. In this case, the computer resources used to run the parametric configurator 101 and parametric data management system 418 are part of a grid computing cluster 2280, a pool of shared resources that may be used to run a variety of applications for a variety of users, possibly using a variety of virtual operating systems; in the cloud 2200, storage 2230 will be shared as well. Users of parametric configuration may be remote from the shared resource, typically utilizing a communication system 2270 such as the Internet.

As will be appreciated by one skilled in the art, however, each of the logical components illustrated in FIG. 21 might be implemented by one or more tangible physical components, acting alone or in combination, locally or remotely. Aspects of the present invention may be embodied as a system, method, or computer program product. Accordingly, aspects of the present invention may take the form of a hardware embodiment, software embodiment (including firmware, embedded software, etc.), or a combination thereof. Furthermore, aspects of the present invention may take the form of a computer program product embodied in one or more tangible computer readable storage 2130 medium(s) having computer readable program code embodied thereon.

Further, the computer readable program code of the present invention may be executed on a computing system having one or more CPUs, a hard drive, memory, graphics card, and/or being interoperable connected to a relational or non-relational database management system. The computer system executing the computer readable program code and other aspects of the presently disclosed embodiments and user interfaces may be executed within an virtualized or non-virtualized implementation of an operating system, such as Windows XP, Windows Vista, Windows 7.0, Unix-based platforms, and Linux-based platforms. The graphical user interface 300 may be embodied directly in the operating system, or operating through another execution platform such as an applet, a web control, or embodied directly within a web site interface. A computational system implementing embodiments of the invention may utilize multiple computers, clustering of computers, operating system virtualization, or techniques of cloud computing. For example, the parametric data management system 418 might be stored online and be accessible across the Internet.

Program code embodied on a computer readable medium may be transmitted using any appropriate medium, including but not limited to wireless, wired, optical fiber cable, RF, or any suitable combination of the foregoing. Computer program code for carrying out operations for aspects of the present invention may be written in any combination of one or more programming languages, including an object oriented programming language such as Java, C#, C++ or the like and conventional procedural programming languages, such as the "C" programming language. The program code may execute all or in part on a user's computer, as a stand-alone software package, and all or in part on a remote computer or server. This remote computer may be connected to the user's computer through any type of network, such as a local area network (LAN) or a wide area network (WAN), or the connection may be made to an external computer (for example, through the Internet using an Internet Service Provider).

Further, the various components of the invention described in the drawings and the disclosure above may be implemented by executable program code or other forms of computer program instructions. These computer program instructions may be provided to one or more processors of a general purpose computer, special purpose computer, or other data processing apparatus, operating serially or in parallel, to produce a particular machine, such that the instructions, which execute via a processor of the computer or other data processing apparatus, create means for implementing the functions/acts specified in the present drawings and disclosure.
Summary of Parametric Configuration As demonstrated with the example of a heavy duty truck driveline 1320 design, a parametric configuration 100 process, controlled by a user 141 through the presently parametric configuration user interface 320 is capable of laying out the complete chassis 904, optimizing the driveline 1320, and determining enough specificity about product parts to generate the bill of materials 134. This is accomplished without using rules that explicitly reference features and part numbers. The parametric configurator 101 achieves the ultimate goal in a parametric configuration 100 process: the best product for the customer 120 with no extra additional engineering and no delay in quoting and manufacturing. Therefore, the parametric configurator 101 functions to create and document new product configurations, selecting the best parametric design 111 that fully meets the customer 120 requirements. Based on the best parametric design 111, the parametric configurator 101 can provide a list of feature codes; generate a request for quote of the new product design; and provide a bill of materials 134. A manufacturer 130 can assemble, manufacture, or fabricate an instance of the product based on the design. Although FIG. 1 displays the manufacturer 130 as outside of parametric configuration 100, obviously some or all aspects of a parametric configuration 100 system and process can be implemented by a manufacturer in-house.

Product design driven by geometric, physical, technological, and business constraints; hierarchical solution of sequential subdesigns; execution rollback; the ability to integrate diverse types of geometric, physical, and other solvers; the ability to select between collective optimization of a set of subdesign solutions and independent optimization; and a language designed for representation, manipulation, search, and optimization of models and constraints, are all advantages of the parametric configuration 100 approach.

Those skilled in the art would recognize that other functions related to the use and creation of product designs with parametric configuration and other mass optimization techniques are within the scope of the present invention. Likewise, many of the process steps and the described system components used within the parametric configuration techniques may be modified, added, or omitted without varying the scope of the present invention.

Although various representative embodiments of this invention have been described above with a certain degree of particularity, those skilled in the art could make numerous alterations to the disclosed embodiments without departing from the spirit or scope of the inventive subject matter set forth in the specification and claims.

Of course, many variations of the above method are possible within the scope of the invention. The present invention is, therefore, not limited to all the above details, as modifications and variations may be made without departing from the intent or scope of the invention. Consequently, the invention should be limited only by the following claims and equivalent constructions.

What is claimed is:

1. An article of manufacture, comprising tangible digital media upon which a representation of constraints pertaining to the design of an object are stored, the constraints being used in the following process:
   a) receiving, in digital form:
      (i) a plurality of constraints on a design of a product,
      (ii) a specification of a plurality of subdesign processes into which a design process, for creating the design, will be divided, the design process being conducted using a computer processing system, wherein one of the subdesign processes searches for solutions using a first type of solver, and another of the subdesign processes searches for solutions using a second, distinct type of solver, and
  (iii) a sequence of a first, a second, and a third subdesign process;
b) selecting in the first subdesign process a candidate solution for the second subdesign process; and
c) evaluating the candidate solution for the second subdesign process, including:
  (i) evaluating at least one candidate solution for the third subdesign process, and
  (ii) rejecting the candidate solution for the second subdesign process if each of the candidate solutions for the third subdesign process respectively violates at least one of the constraints.

* * * * *